(12) United States Patent
Wu et al.

(10) Patent No.: US 11,209,728 B2
(45) Date of Patent: Dec. 28, 2021

(54) MASK AND METHOD FOR FABRICATING THE SAME

(71) Applicant: TAIWAN SEMICONDUCTOR MANUFACTURING COMPANY LTD., Hsinchu (TW)

(72) Inventors: Huang-Ming Wu, Hsinchu (TW); Jiun-Hao Lin, Hsinchu (TW); Jia-Guei Jou, New Taipei (TW); Chi-Ta Lu, Yilan County (TW); Chi-Ming Tsai, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 197 days.

(21) Appl. No.: 16/254,147

(22) Filed: Jan. 22, 2019

(65) Prior Publication Data
US 2020/0004136 A1 Jan. 2, 2020

Related U.S. Application Data

(60) Provisional application No. 62/690,610, filed on Jun. 27, 2018.

(51) Int. Cl.
| | |
|---|---|
| *G03F 1/42* | (2012.01) |
| *G03F 1/36* | (2012.01) |
| *G03F 7/26* | (2006.01) |
| *G03F 7/16* | (2006.01) |
| *G03F 7/20* | (2006.01) |
| *G06F 30/398* | (2020.01) |

(52) U.S. Cl.
CPC .................. *G03F 1/42* (2013.01); *G03F 1/36* (2013.01); *G03F 7/16* (2013.01); *G03F 7/20* (2013.01); *G03F 7/26* (2013.01); *G06F 30/398* (2020.01)

(58) Field of Classification Search
None
See application file for complete search history.

(56) References Cited

U.S. PATENT DOCUMENTS

| | | | |
|---|---|---|---|
| 6,363,296 B1 * | 3/2002 | Schulze | G03F 1/84 |
| | | | 700/121 |
| 8,762,900 B2 | 6/2014 | Shin et al. | |
| 8,796,666 B1 | 8/2014 | Huang et al. | |
| 8,812,999 B2 | 8/2014 | Liu et al. | |

(Continued)

*Primary Examiner* — Kathleen Duda
(74) *Attorney, Agent, or Firm* — WPAT, P.C., Intellectual Property Attorneys; Anthony King

(57) ABSTRACT

Present disclosure provide a method for fabricating a mask, including obtaining a target pattern to be imaged onto a substrate, providing a first scattering bar and a second scattering bar adjacent to consecutive edges of the target pattern, identifying a first length of the first scattering bar and a second length of the second scattering bar, connecting the first scattering bar and the second scattering bar when any of the first length and the second length is smaller than a predetermined value, identifying a separation between the first scattering bar and the second scattering bar subsequent to identifying the first length and the second length, disposing the first scattering bar and the second scattering bar in a first fashion when the separation is equal to zero, and disposing the first scattering bar and the second scattering bar in a second fashion when the separation is greater than zero.

20 Claims, 22 Drawing Sheets

(56) References Cited

U.S. PATENT DOCUMENTS

| | | |
|---|---|---|
| 8,850,366 B2 | 9/2014 | Liu et al. |
| 8,906,595 B2 | 12/2014 | Liu et al. |
| 8,945,803 B2 | 2/2015 | Chen et al. |
| 8,954,899 B2 | 2/2015 | Wu et al. |
| 8,987,689 B2 | 3/2015 | Chen et al. |
| 9,093,530 B2 | 4/2015 | Huang et al. |
| 9,269,537 B2 | 2/2016 | Tseng et al. |
| 9,305,799 B2 | 4/2016 | Chen et al. |
| 9,336,993 B2 | 5/2016 | Yu |
| 9,367,655 B2 | 6/2016 | Shih et al. |
| 9,367,661 B2 | 6/2016 | Jou et al. |
| 9,390,217 B2 | 7/2016 | Wang et al. |
| 9,529,959 B2 | 12/2016 | Wang et al. |
| 9,548,303 B2 | 1/2017 | Lee et al. |
| 2010/0009139 A1* | 1/2010 | Yang ................. G03F 1/36 428/195.1 |

* cited by examiner

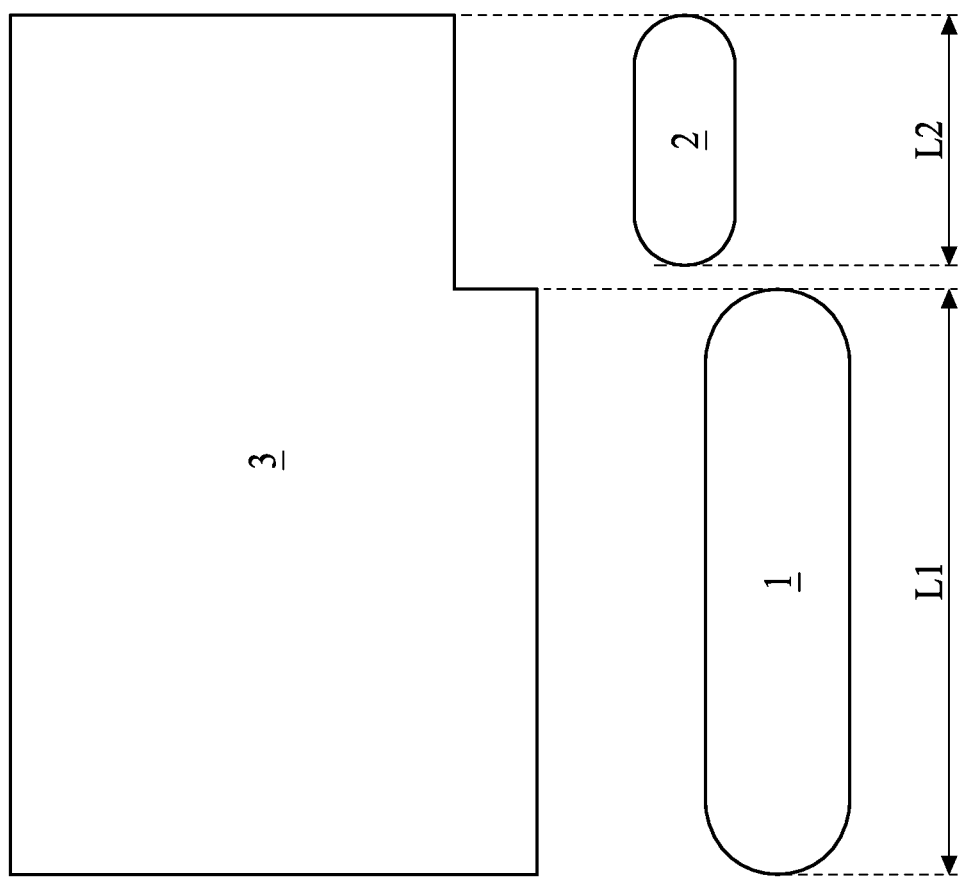

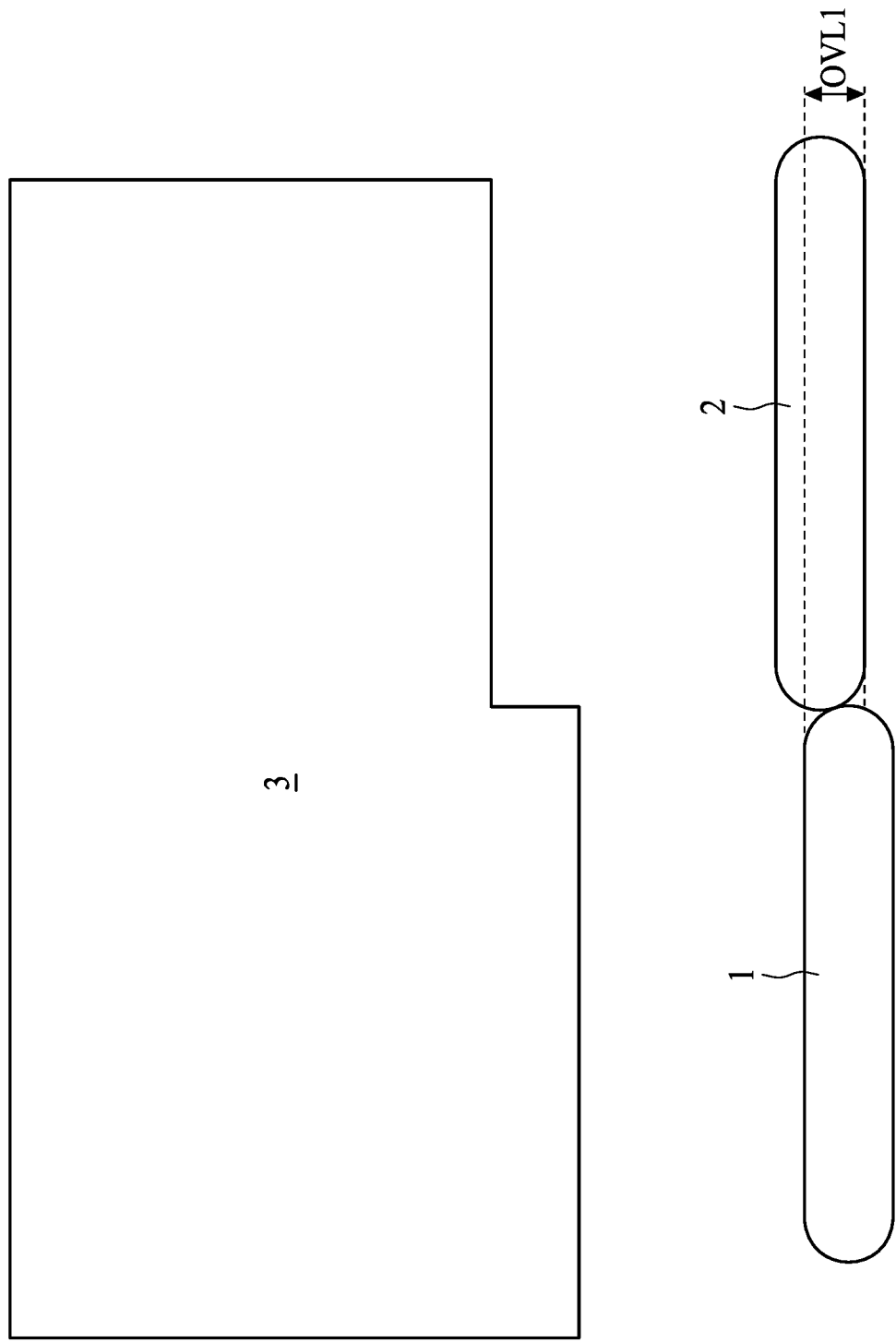

| Combination | Separation (Xn) | Overlap (Yn) | Spacing: (SPCn) |
|---|---|---|---|
| 1 | X1 | Y1 | SPC1 |
| 2 | X2 | Y2 | SPC2 |
| 3 | X3 | Y3 | SPC3 |
| 4 | X4 | Y4 | SPC4 |

MASK AND METHOD FOR FABRICATING THE SAME

CROSS REFERENCE TO RELATED APPLICATIONS

This application claims the benefit of prior-filed provisional application No. 62/690,610, filed Jun. 27, 2018.

BACKGROUND

In semiconductor industry, photolithography can be used to transfer a design from a photomask onto a surface of a substrate. As advances in semiconductor industry continually provide semiconductor structures with smaller features, smaller critical dimensions, or even denser pattern, however, the fabrication of such structures may be difficult to perform due to various unique behaviors of projected light. When the sizes of the features are near or under the wavelength of the projected light, obscured edges, missized patterns, rounded corners, distorted patterns, unresolvable patterns, or two closely disposed features being undisguisable may be induced, further causing lower yield rate.

Optical proximity correction (OPC) is one of the conventional techniques which may enhance the performance of photomasks. Scattering bars, also known as scan bars, scatter bars, or sub-resolution assist features (SRAFs), can be placed nearby or between the to-be-imaged features to improve the sharpness of the pattern-imaging in lithography. The scattering bars may ameliorate the depth of focus or alter the effective pattern density, further improve the precision and resolution of lithographical patterning. However, due to the restrictions of disposing scattering bars, the lithography performance of the scattering bars may be lowered.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 5A to 5E are top views of a mask during an intermediate stage of manufacturing operations, in accordance with some embodiments of the present disclosure.

FIG. 7A to 7D are schematic diagrams illustrating a mask during an intermediate stage of manufacturing operations, in accordance with some embodiments of the present disclosure.

FIG. 8C is a lookup table for fabricating a mask, in accordance with some embodiments of the present disclosure.

DETAILED DESCRIPTION OF THE DISCLOSURE

Figure 1:
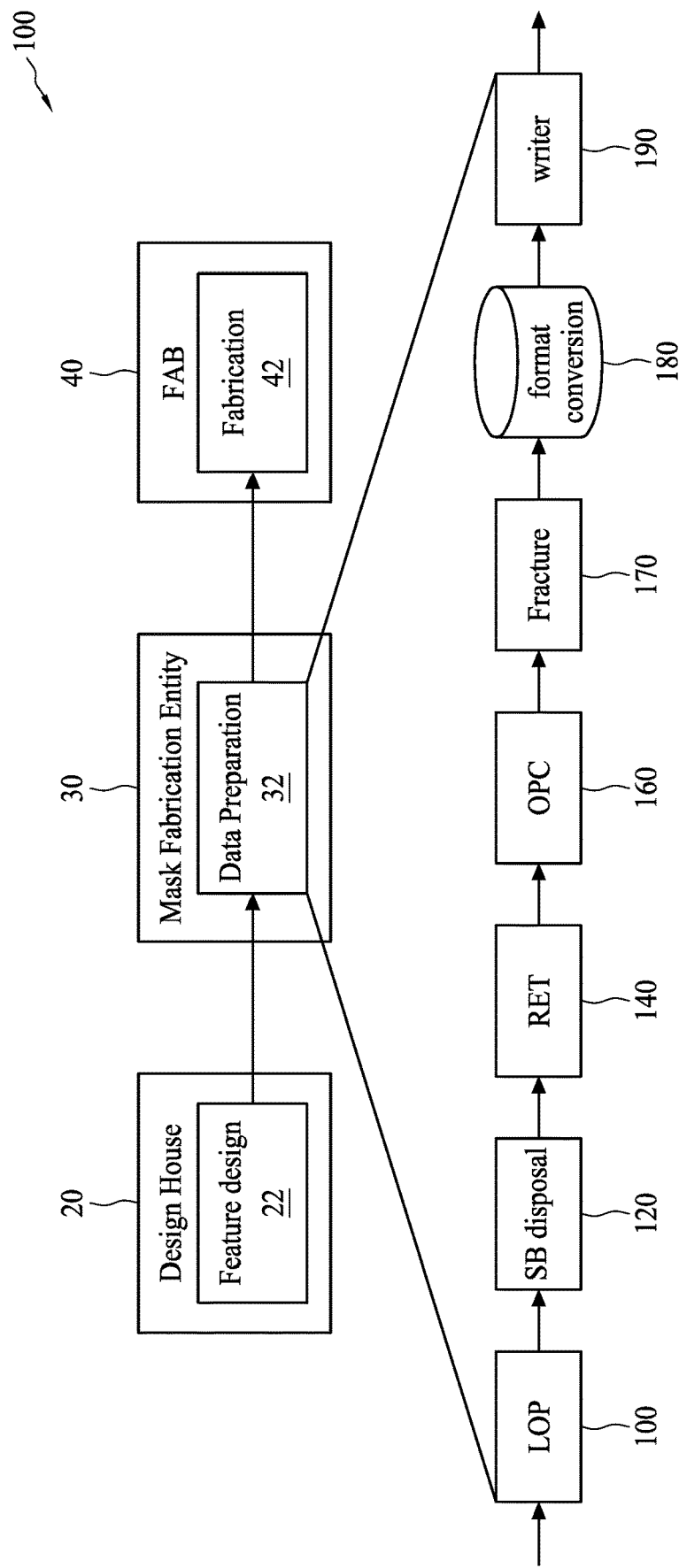
FIG. 1 is a block diagram representing methods for fabricating a mask, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of h) amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Scattering bars can be used for improving optical proximity correction (OPC) by improve the sharpness of patterning. The scattering bars have small, sub-resolution dimensions, thus the scattering bars per se may not be projected onto a projected image of a design. The scattering bars can be placed adjacent to consecutive edges of features to improve the effectiveness of photolithographic patterning, for example, since the closely spaced features may be projected clearer than isolated features that are apart from the closely spaced features, the scattering bars can be placed alongside the isolated features to improve the projection of isolated features.

Due to the limitations of mask fabrication and/or the restrictions of mask fabrication writers, such as a space between two neighboring scattering bars may not be lower than a predetermined limitation, or the scattering bars also may not be shorter than a predetermined length, conventionally, closely spaced scattering bars and/or undersized scattering bars may be replaced by a straight scattering bar in order to comply with the limitations of mask fabrication and/or the restrictions of mask fabrication writers. However the aforesaid straight scattering bar may not be closely tracking in accordance with the contour of the consecutive edges of the features, thence the effectiveness of OPC modification may be deteriorated by inaccurate depth of focus and/or imprecise effective pattern density. The aforesaid straight scattering bar may cause a lower performance under the review of lithographical performance. For example, inspecting Image Log Slope (ILS) is one of the common lithographical performance evaluation operations. The mask regions with insufficient Image Log Slope (ILS) can be identified and addressed with optimized mask fabrication operations to enhance performance.

Present disclosure provides methods for fabricating masks and adjusting scattering bars to enhance the performance of the masks while complying with the limitations of mask fabrication and/or the restrictions of mask fabrication writers.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Referring to FIG. 1, FIG. 1 is a block diagram illustrating a process flow 100 for fabricating a mask according to aspects of the present disclosure in some embodiments. In operation 22, features of a given structure, for example integrated circuit (IC) or a semiconductor structure on a substrate, is designed. The operation 22 may include logic design, schematic design, physical design, or the combination thereof for generating a design layout. The designing of features may be implemented by a design house 20. The design layout generated from the operation 22 may be subsequently provided to a mask fabrication entity 30. The design layout may be provided in one or more data files with information pertinent to a target pattern to be imaged onto a substrate. The mask fabrication entity 30 subsequently prepares to manufacture masks based on the design layout. In operation 32, the mask fabrication entity 30 may perform data preparation. The mask fabrication entity 30 obtains the target pattern to be imaged onto a substrate and further transform the obtained design layout into a converted layout which can be written by a mask writer, such as an e-beam writer. In some embodiments, the operation 32 may further include a mask tooling operation, wherein the design layout can be modified to comply with a specific mask writer and/or a mask manufacturer. The mask can be subsequently formed via various technologies. In some embodiments, the mask is formed using the binary technology, phase shift technology, etching, or the like, as the disclosure is not limited thereto. In operation 42, the mask fabricated in operation 32 may be used to fabricate IC, substrates, wafers or semiconductor structures subsequently in fabrication entity 40.

In some embodiments, the operation 32 may further include several operations, such as logic operation (LOP) 100, scattering bars (SB) disposal 120, retarget (RET) 140, optical proximity correction (OPC) 160, format conversion 180, and/or writing 190. In operation 100, LOP is performed to modify the design layout according to manufacturing rules. In operation 120, the scattering bars are disposed adjacent to consecutive edges of the target pattern; herein the operational details of scattering bars disposal will be subsequently discussed in FIG. 2 to FIG. 8C. A dummy insertion feature for uniforming thermal effect under subsequent thermal operation may, or may not also be applied in operation 120. In operation 140, during the RET operation, the design layout is modified based on various rules such that a modified design layout has an improved resolution and precision. The RET operation 140 may further include resizing features, repositioning features, reshaping features, adding assistant features such as scattering bars, dummy insertion features, or the combination thereof. In operation 160, OPC is a lithography enhancement technique used to compensating image errors, such as those that can be induced by diffraction, interference, or other effects. The OPC operation may further include resolution enhancement operations, such as off-axis illumination, sub-resolution assist features, phase-shifting masks, other suitable techniques, or combinations thereof. In some embodiments, a fracture operation 170 may be performed subsequent to operation 160, wherein the design layout is fractured into multiple segments for subsequent operation 180.

In operation 180, the modified design layout is converted to a format compatible to a mask writer, such as an e-beam mask writer. In operation 190, the mask writer is prepared for mask fabrication. For example, during the writing process, a mask blank is coated with an electron-sensitive resist layer and transferred to the writer. One or more e-beams may be generated and directed to the electron-sensitive resist layer. The electron-sensitive resist layer is further developed to form a patterned resist layer. One or more material layer on the mask blank is etched using the patterned resist layer as an etch mask. In some other another embodiments, the e-beam may be directly used to etch the material layer on the photomask blank according to the design layout. Note that the operations of fabricating masks by the mask writers are not limited thereto. The mask fabricated herein can be used in fabricating substrate, wafer, IC, or semiconductor structure in fabrication entity 40.

Figure 2:
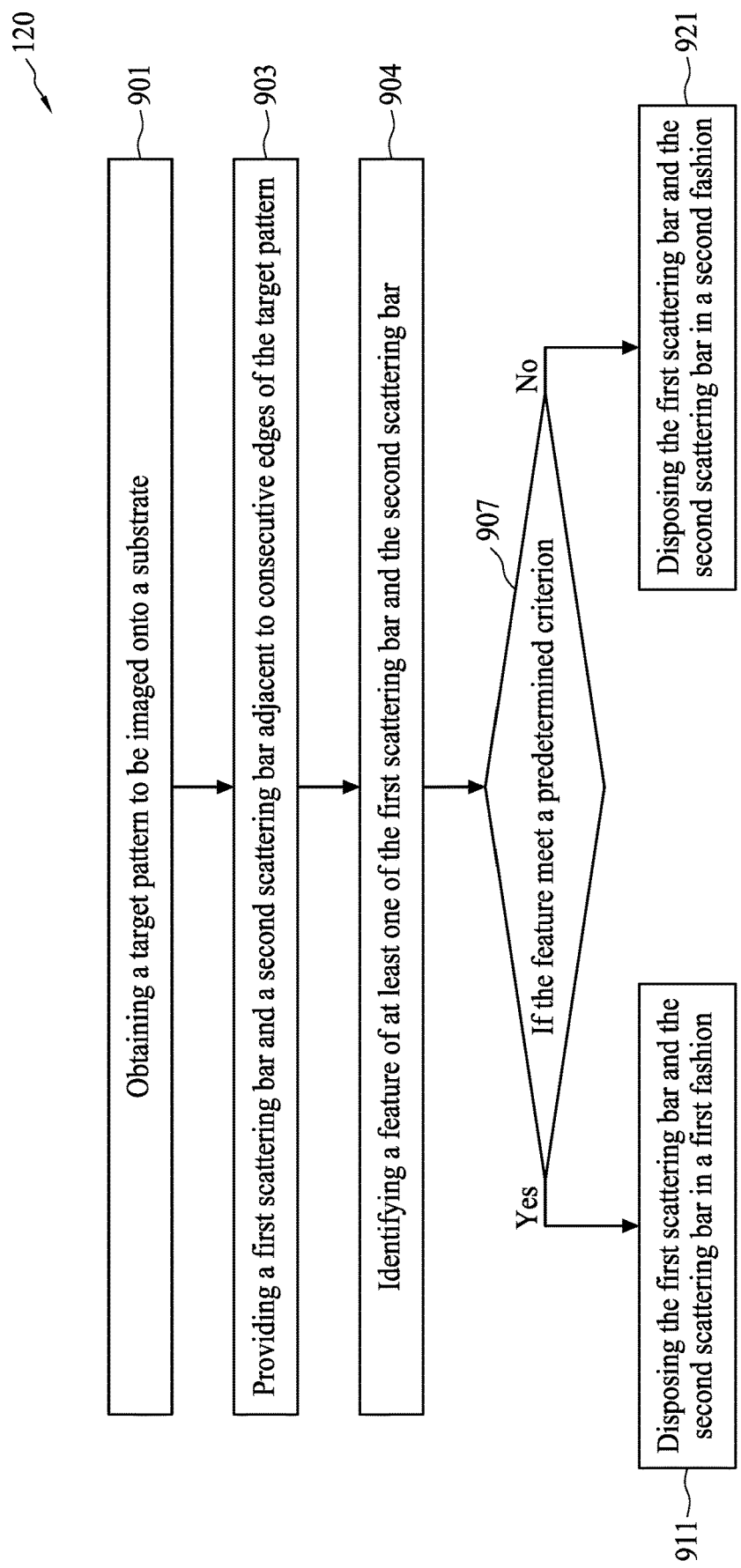
FIG. 2 is a flow chart representing methods for fabricating a mask, in accordance with some embodiments of the present disclosure.

Referring to FIG. 2 and FIG. 5A, FIG. 2 illustrates an exemplary process flow 120 of scattering bar disposal previously discussed in FIG. 1, and FIG. 5A is a schematic diagram illustrating a mask during an intermediate stage of manufacturing operations. In operation 901, a target pattern 3 (shown in FIG. 5A) to be imaged onto a substrate is obtained. The target pattern 3 may be derived from the design layout generated in operation 22 (shown in FIG. 1). In operation 903, at least a first scattering bar 1 and a second scattering bar 2 are provided. The first scattering bar 1 and the second scattering bar 2 are placed adjacent to consecutive edges of the target pattern 3. The consecutive edges of the target pattern 3 may include straight edges, collinear edges, slant edges, curved edges, or the combination thereof. In some embodiments, at least one end of the first scattering bar 1 and the second scattering bar 2 shows a pattern with rounded corner, or a fillet, as described herein. In some embodiments, each corner of the first scattering bar 1 and the second scattering bar 2 has fillet.

In operation 904, a feature of at least one of the first scattering bar 1 and the second scattering bar 2 is identified. For example, a first length L1 of the first scattering bar 1, a second length L2 of the second scattering bar 2 can be identified. As will be subsequently discussed in FIG. 6A and FIG. 7A, widths of the scattering bars, relative displacement features between the first scattering bar 1 and the second scattering bar 2, a first separation SP1 between the first scattering bar 1 and the second scattering bar 2, a transversal overlap OVL1 between the first scattering bar 1 and the second scattering bar 2, or the like, may also be identified in operation 904. In operation 907, the one or more features identified in operation 904 may be compared to at least one predetermined criterion. If a feature meets a predetermined criterion, the flow 120 may proceed to operation 911, as the first scattering bar 1 and the second scattering bar 2 are disposed in a first fashion. If a feature does not meet a predetermined criterion, the flow 120 may proceed to operation 921, as the first scattering bar 1 and the second scattering bar 2 are disposed in a second fashion. The first fashion is different from the second fashion. Details of the predetermined criterion, the first fashion, and the second fashion are addressed accordingly in the following of this disclosure.

Figure 3:
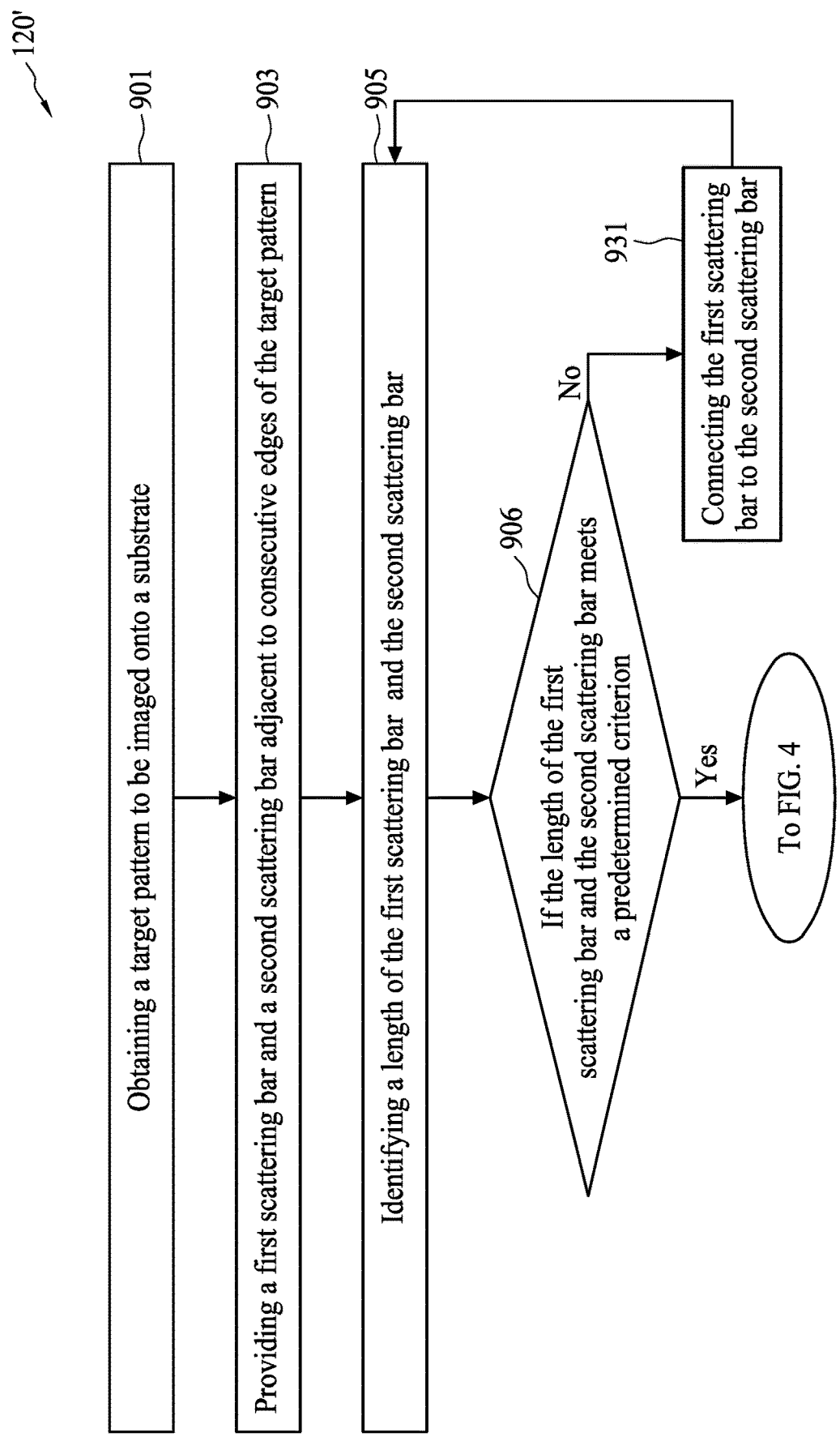
FIG. 3 is a flow chart representing methods for fabricating a mask, in accordance with some embodiments of the present disclosure.
Figure 5B:
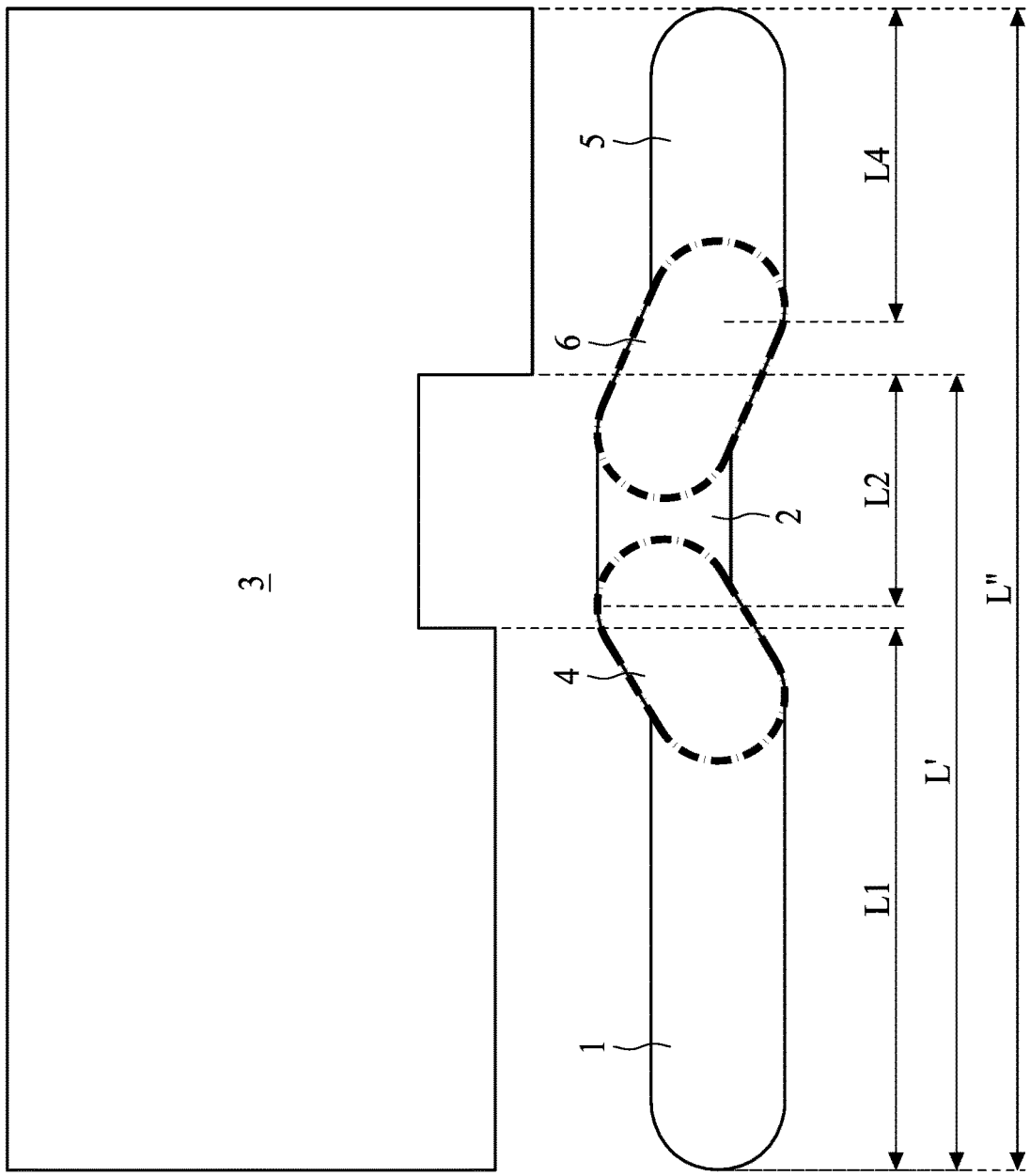

Referring to FIG. 3, FIG. 5A, and FIG. 5B, FIG. 3 illustrates an exemplary process flow 120' of scattering bar disposal previously discussed in FIG. 1, and FIG. 5B is a schematic diagram illustrating a mask during an intermediate stage of manufacturing operations. Similar to the process flow provided in FIG. 2, in operation 901, the target pattern 3 is obtained. In operation 903, at least the first scattering bar 1 and the second scattering bar 2 are provided. The first scattering bar 1 and the second scattering bar 2 are placed adjacent to consecutive edges of the target pattern 3. Subsequent to operation 903, the operation may proceed to operation 905, wherein a first length L1 of the first scattering bar 1 and a second length L2 of the second scattering bar 2 are identified. In operation 906, the first length L1 and the second length L2 are compared to a predetermined criterion.

For example, a minimum total scattering bar length $L_{min}$ may be adopted as the predetermined criterion to compare with the first length L1 and the second length L2. The minimum total scattering bar length $L_{min}$ depends from technology generation of the features, that is, each technology generation may entail different minimum scattering bar lengths on the corresponding mask. For instance, under the technology nodes of 40 nm and 28 nm, the minimum total scattering bar length $L_{min}$ may range from about 50 nm to about 80 nm.

For example, the first length L1 and the second length L2 are compared to the minimum total scattering bar length $L_{min}$. If a length of the scattering bar is smaller than the minimum total scattering bar length $L_{min}$, the scattering bar may not be able to be formed due to the limit of the e-beam writer.

Figure 4:
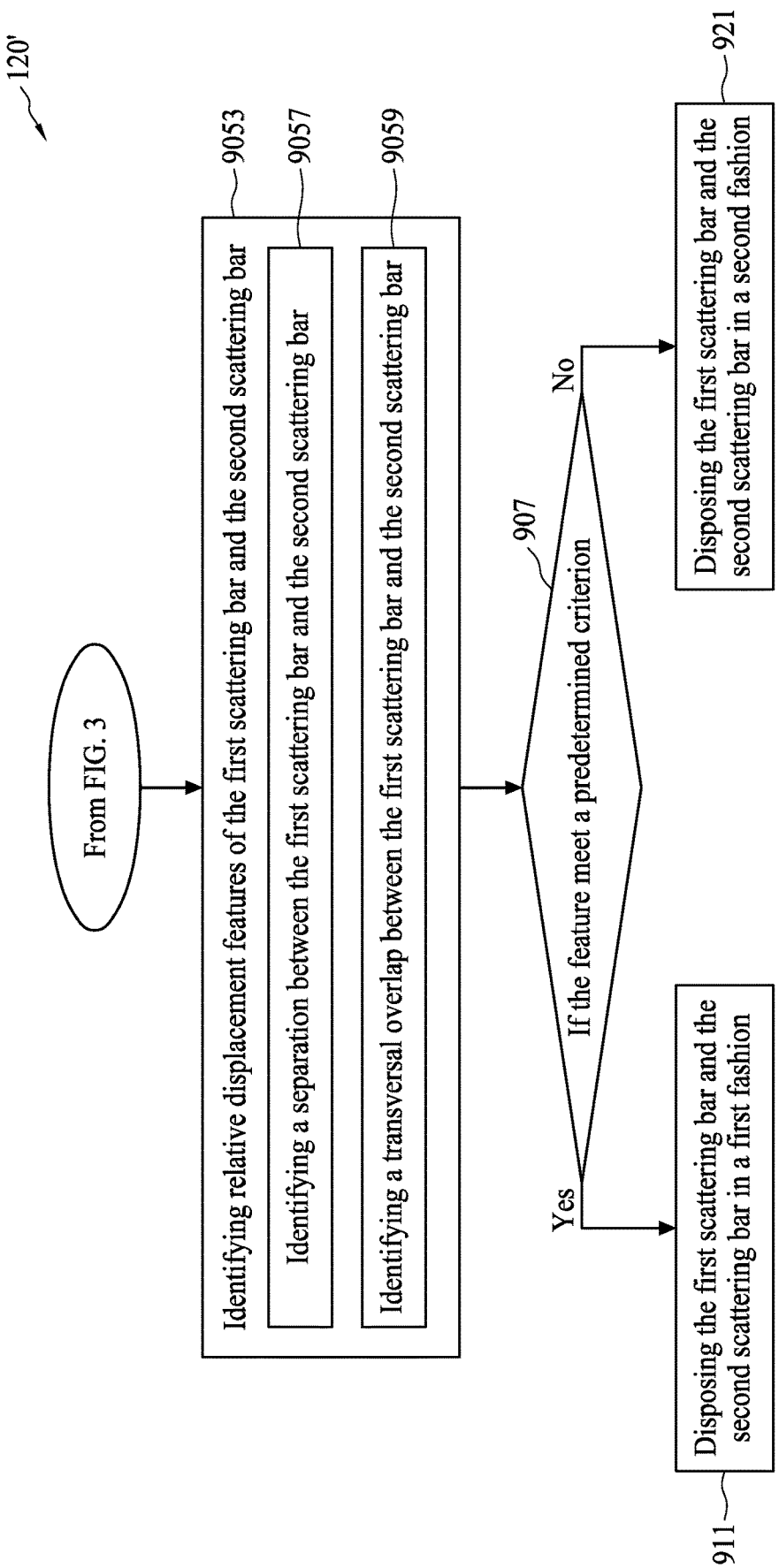
FIG. 4 is a flow chart representing methods for fabricating a mask, in accordance with some embodiments of the present disclosure.

If both the first length L1 and the second length L2 are greater than or equal to the minimum total scattering bar length $L_{min}$, the flow 120' proceeds to operation 9053 in FIG. 4. If one of the first length L1 or the second length L2 is smaller than the minimum total scattering bar length $L_{min}$, the flow 120' proceeds to operation 931. In operation 931, the first scattering bar 1 and the second scattering bar 2 may be connected. In some embodiments, no relative displacement is caused when connecting the first scattering bar 1 and the second scattering bar 2, as shown in FIG. 5B.

Referring to FIG. 5B, in some embodiments, the first scattering bar 1 and the second scattering bar 2 may be connected by a third scattering bar 4, with an end of the third scattering bar 4 connected to an end of the first scattering bar 1, another end of the third scattering bar 4 connected to an end of the second scattering bar 2. In some embodiments, the third scattering bar 4 may have a line width substantially identical to that of the first scattering bar 1. Subsequently, the flow 120' proceeds to operation 905 for iterating the length identification and length comparison. The third length L' of the connected first scattering bar 1, the second scattering bar 2, and the third scattering bar 4 in a transversal direction is identified. Similarly, if the third length L' is greater than or equal to the minimum total scattering bar length $L_{min}$, the flow 120' proceeds to operation 9053 in FIG. 4.

If the third length L' is still smaller than the minimum total scattering bar length $L_{min}$, a fourth length L4 of the fourth scattering bar 5 adjacent to the first scattering bar 1 (not shown), or adjacent to the second scattering bar 2, will be identified. The fourth scattering bar 5 is also placed adjacent to consecutive edges of the target pattern 3. As shown in FIG. 5B, in some embodiments, the fourth scattering bar 5 and the second scattering bar 2 may be connected by a fifth scattering bar 6, with an end of the fifth scattering bar 6 connected to an end of the fourth scattering bar 5, and another end of the fifth scattering bar 6 connected to another end of the second scattering bar 2. In some embodiments, the fifth scattering bar 6 may have a same line width with that of the second scattering bar 2.

A fifth length L" will be identified in a transversal direction combining the first scattering bar 1, the second scattering bar 2, the third scattering bar 4, and the fourth scattering bar 5, and the fifth scattering bar 6. The operation 931 of connecting adjacent scattering bars may be repeatedly performed until a length measured in a transversal direction combining all the connected scattering bars being greater than or equal to the minimum total scattering bar length $L_{min}$, and the flow 120' proceeds to operation 9053 in FIG. 4.

Figure 5C:
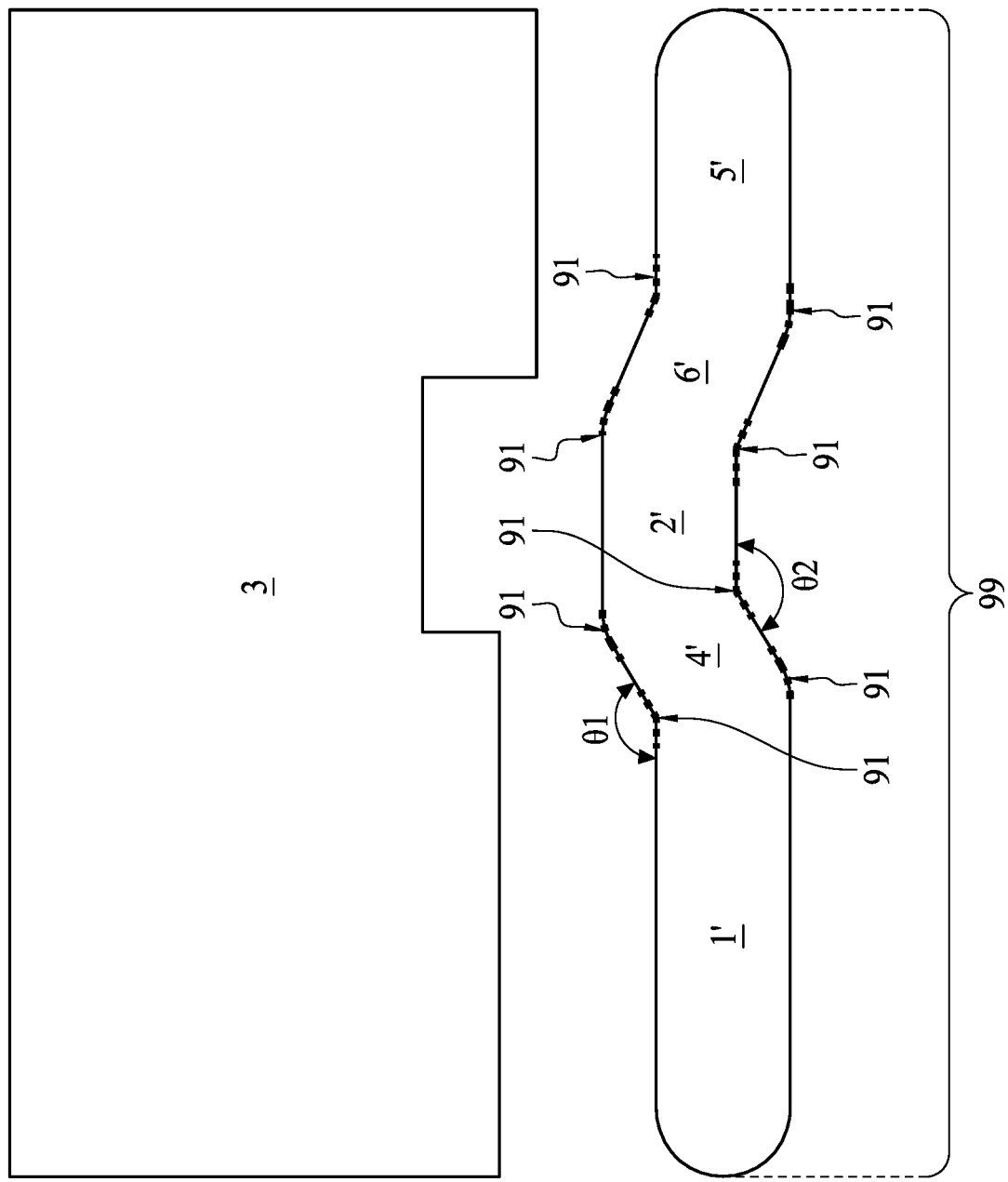
Figure 5D:
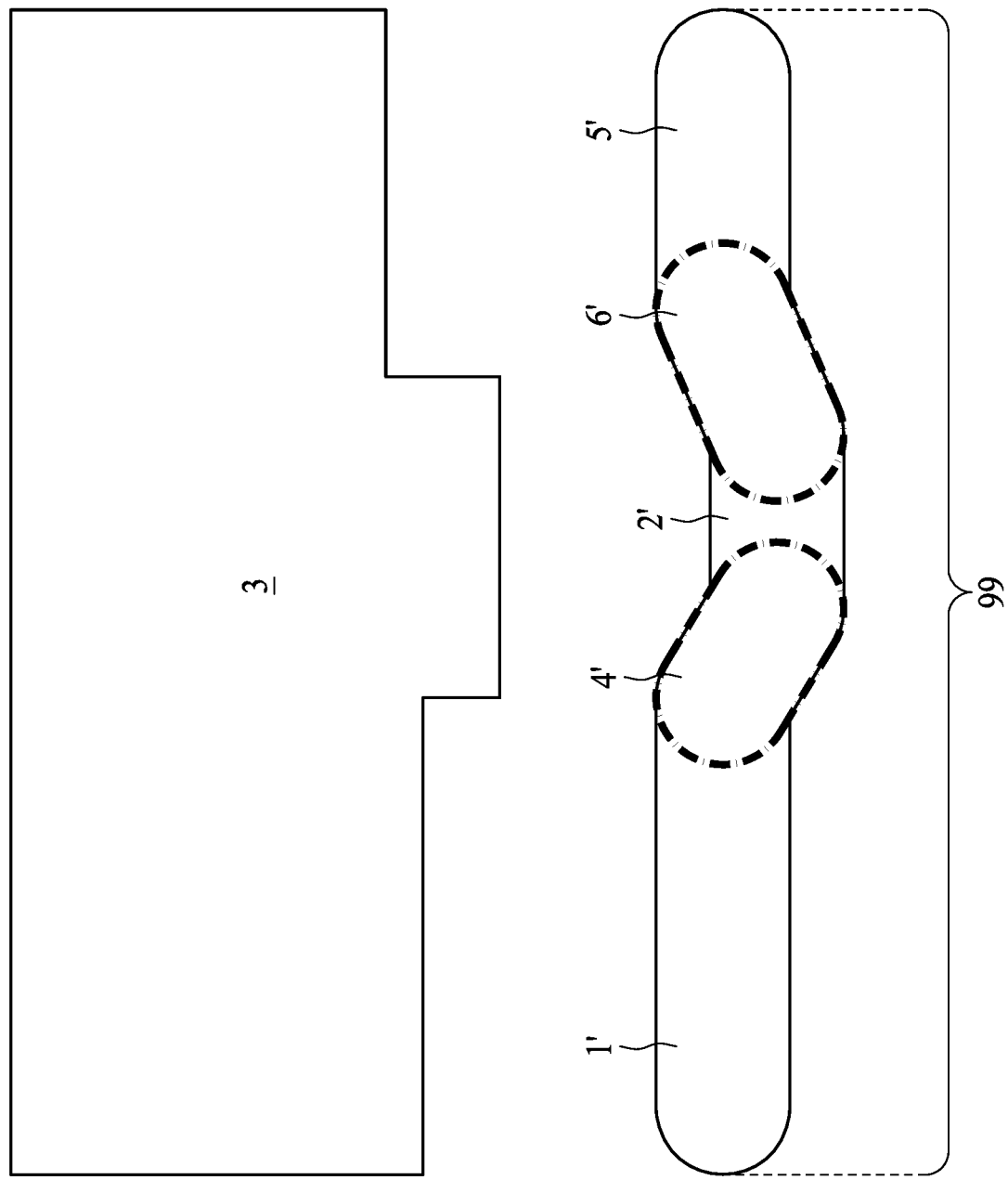
Figure 5E:
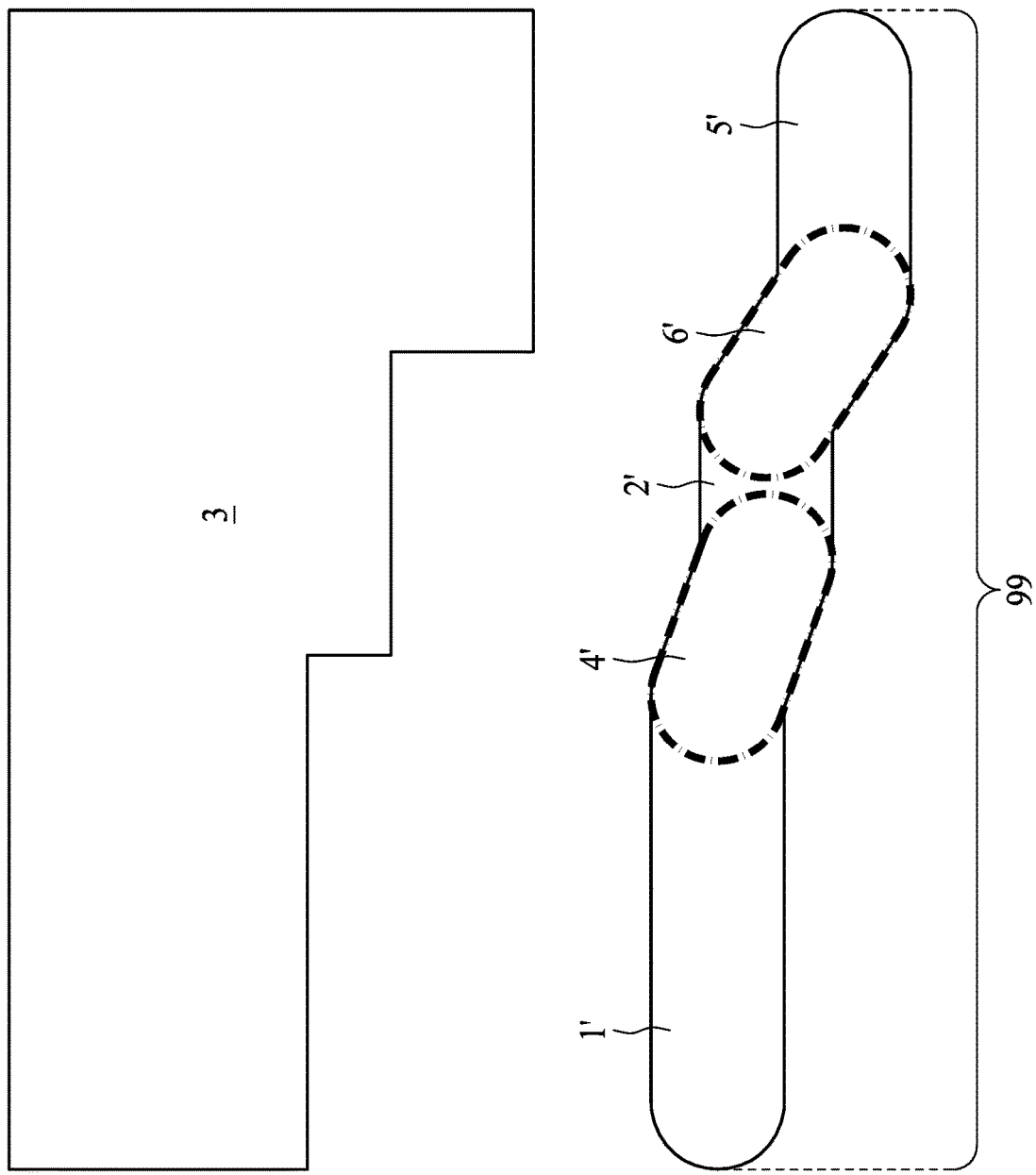

Referring to FIG. 5C to FIG. 5E, FIG. 5C and FIG. 5E illustrate top views of a mask during intermediate stages of manufacturing operations. After the connection of the scattering bars, a connected scattering bar 99 is thereby formed. Alternatively stated, the connected bar 99 at least includes a first segment 1', a second segment 2', and a third segment 4'. The third segment 4' has an end connecting to the first segment 1' and another end connecting to the second segment 2'. In some embodiments, the first segment 1' and the second segment 2' are substantially parallel. A first angle θ1 between the first segment 1' and the third segment 4' is less than 180 degrees. A second angle θ2 between the second segment 2' and the third segment 4' is less than 180 degrees. In some embodiments, fillets 91 can be formed between an edge of the first segment 1' and an adjacent edge of the third segment 4'. Fillets 91 can also be formed between an edge of the second segment 2' and an edge of the third segment 4'.

In some embodiments, the connected scattering bar 99 further includes a fourth segment 5' and a fifth segment 6'. The fourth segment 5' and the second segment 2' may be connected by the fifth segment 6', with an end of the fifth segment 6' connected to an end of the fourth segment 5', and another end of the fifth segment 6' connected to the second segment 2'. In some embodiments, the fourth segment 4' and the first segment 1' may also be substantially parallel. An angle between the fifth segment 6' and the fourth segment 5' and an angle between the fifth segment 6' connected to another end of the second segment 2' are less than 180 degrees. In some embodiments, fillets 91 can be formed between an edge of the fourth segment 5' and an adjacent edge of the fifth segment 6'. Fillets 91 can also be formed between an edge of the second segment 2' and the fifth segment 6'.

Referring to FIG. 5C, in some embodiments, the second segment 2' is closer to the target pattern 3 than the first segment 1', and the second segment 2' is closer to the target pattern 3 than the fourth segment 5'. Referring to FIG. 5D, in some embodiments, the first segment 1' is closer to the target pattern 3 than the second segment 2', and the fourth segment 5' is closer to the target pattern 3 than the second segment 2'. Referring to FIG. 5D, in some embodiments, the first segment 1' is closer to the target pattern 3 than the second segment 2', and the second segment 2' is closer to the target pattern 3 than the fourth segment 5'. It is noteworthy that the number of segments is not limited in this disclosure, all similar embodiments having a length greater than the minimum total scattering bar length $L_{min}$ are under consideration.

Figure 6A:
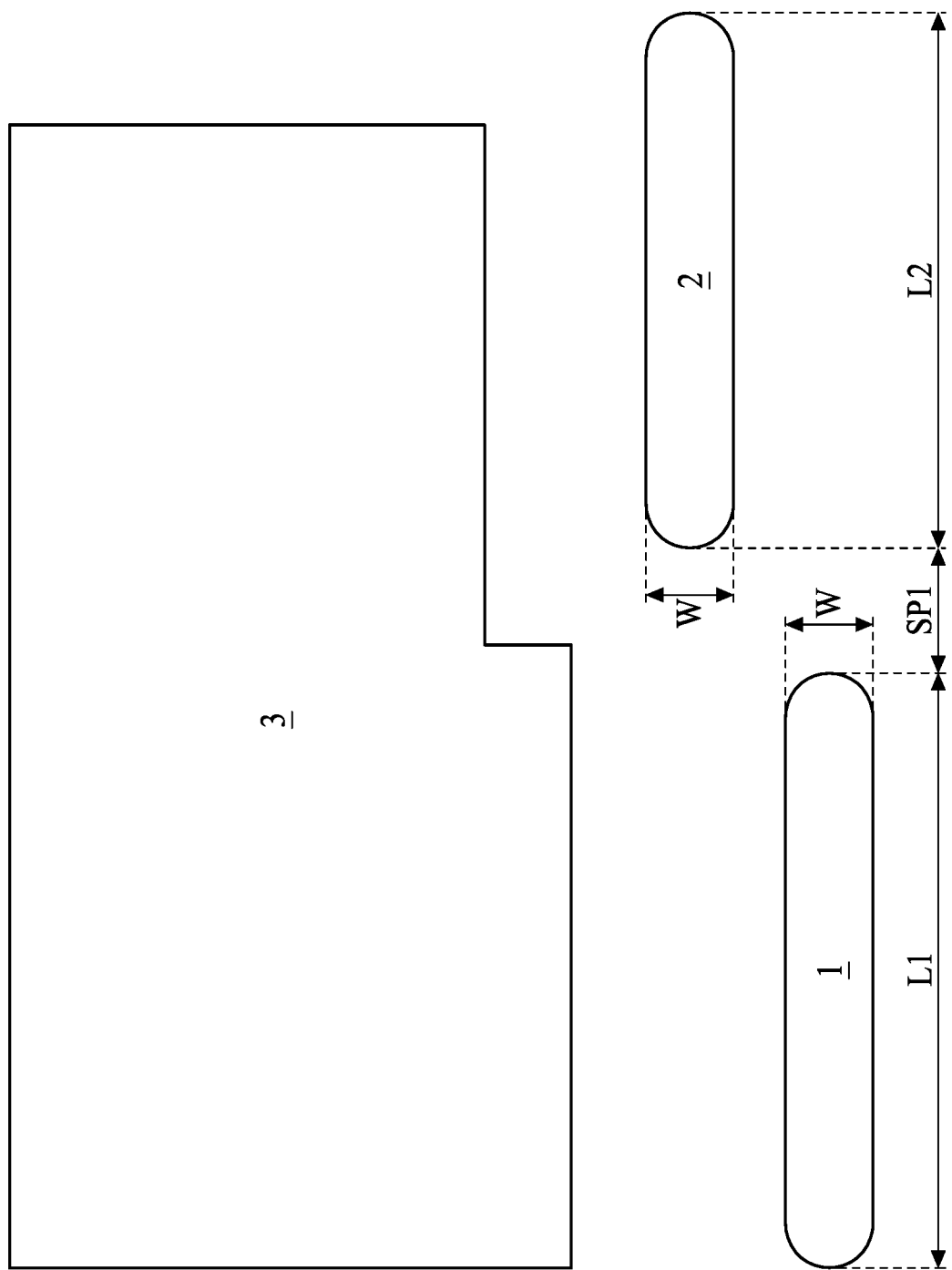
FIG. 6A to 6E are top views of a mask during an intermediate stage of manufacturing operations, in accordance with some embodiments of the present disclosure.
Figure 6B:
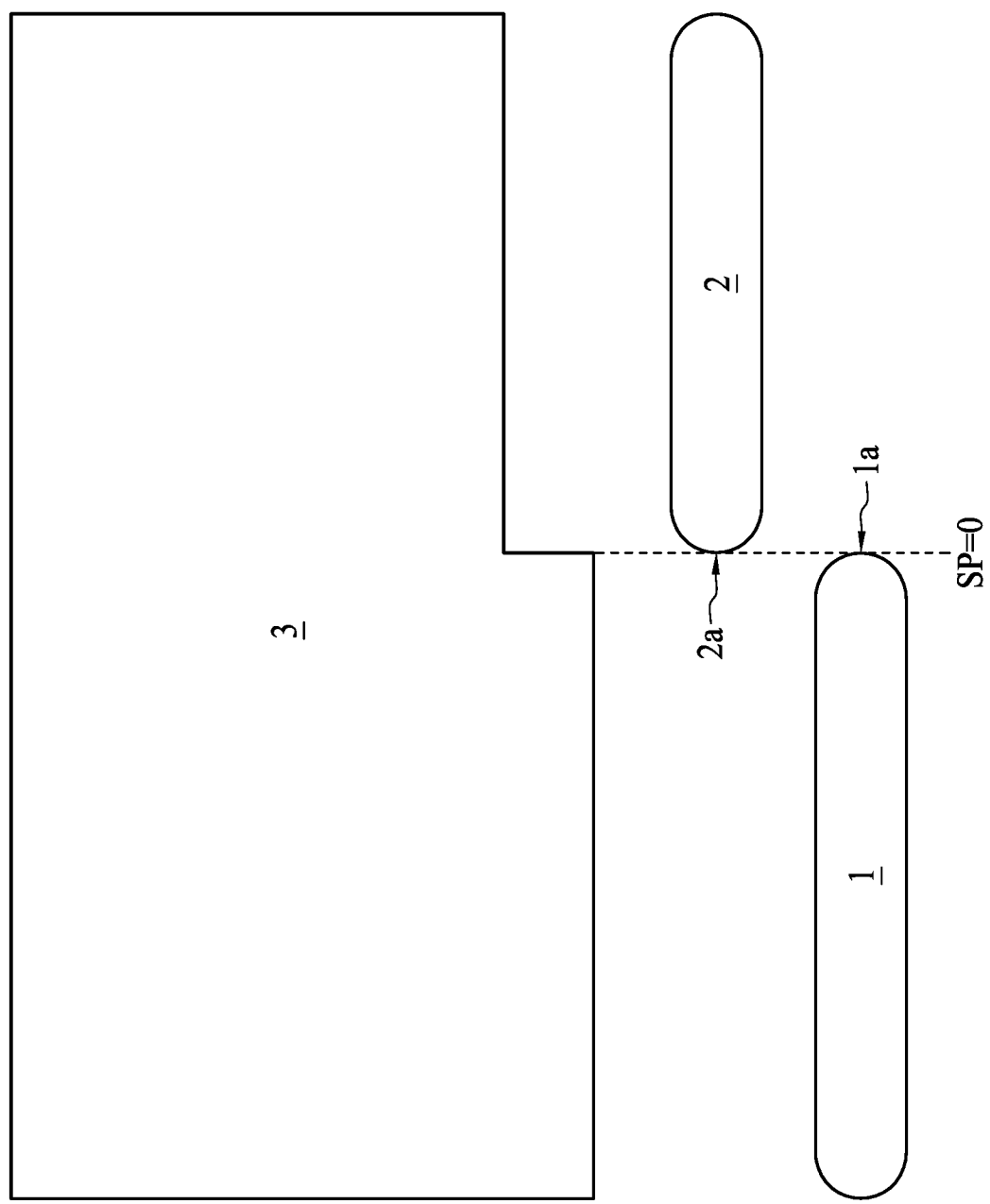

Referring to FIG. 4 and FIG. 6A to FIG. 8B, FIG. 4 illustrates an exemplary process flow 120' of scattering bar disposal succeeding FIG. 3, and FIG. 6A to FIG. 8B are schematic diagrams illustrating a mask during an intermediate stage of manufacturing operations. If both the first length L1 and the second length L2 are greater than or equal to the minimum total scattering bar length $L_{min}$, the flow 120' proceeds to operation 9053. In operation 9053, relative displacement features of the first scattering bar 1 and the second scattering bar 2 is identified. In some embodiments, the operation 9053 includes a first sub-operation 9057, identifying a first separation SP1, which is measured laterally between the first scattering bar 1 and the second scattering bar 2, as shown in FIG. 6A. If the first scattering bar 1 and the second scattering bar 2 are laterally separated from each other, the SP1 is non-zero or greater than zero. If an edge 1a of the first scattering bar 1 and an edge 2a of the second scattering bar 2 facing the edge 1a are vertically aligned, as shown in FIG. 6B, then the SP1 is equal to zero. In some embodiments, the operation 9053 includes a second sub-operation 9059, identifying a first transversal overlap OVL1 between the first scattering bar 1 and the second scattering bar 2, as shown in FIG. 7A. If the first scattering bar 1 and the second scattering bar 2 are transversally overlapped with each other, the OVL1 is greater than zero. If the first scattering bar 1 and the second scattering bar 2 are transversally non-overlapped with each other, the OVL1 is less than zero.

In some embodiments, operation 9053 includes both sub-operation 9057 and sub-operation 9059. In some embodiments, sub-operation 9057 is performed prior to sub-operation 9059. In some other embodiments, sub-operation 9057 is performed subsequent to sub-operation 9059. In some other embodiments, sub-operation 9057 and sub-operation 9059 are performed simultaneously. In some other embodiments, only one of the sub-operation 9057 or 9059 is performed during operation 9053. In some embodiments, operation 9053 further includes identifying a width W1 of the first scattering bar 1 and a width W2 of the second scattering bar 2. In some embodiments, a width W1 of the first scattering bar 1 and a width W2 of the second scattering bar 2 are identical, as shown in FIG. 6A. In some other embodiments, a width W1 of the first scattering bar 1 and a width W2 of the second scattering bar 2 are different. In this connection, the width of all the scattering bars measured may be determined as a value in a range within the first width W1 and the second width W2.

Figure 7B:
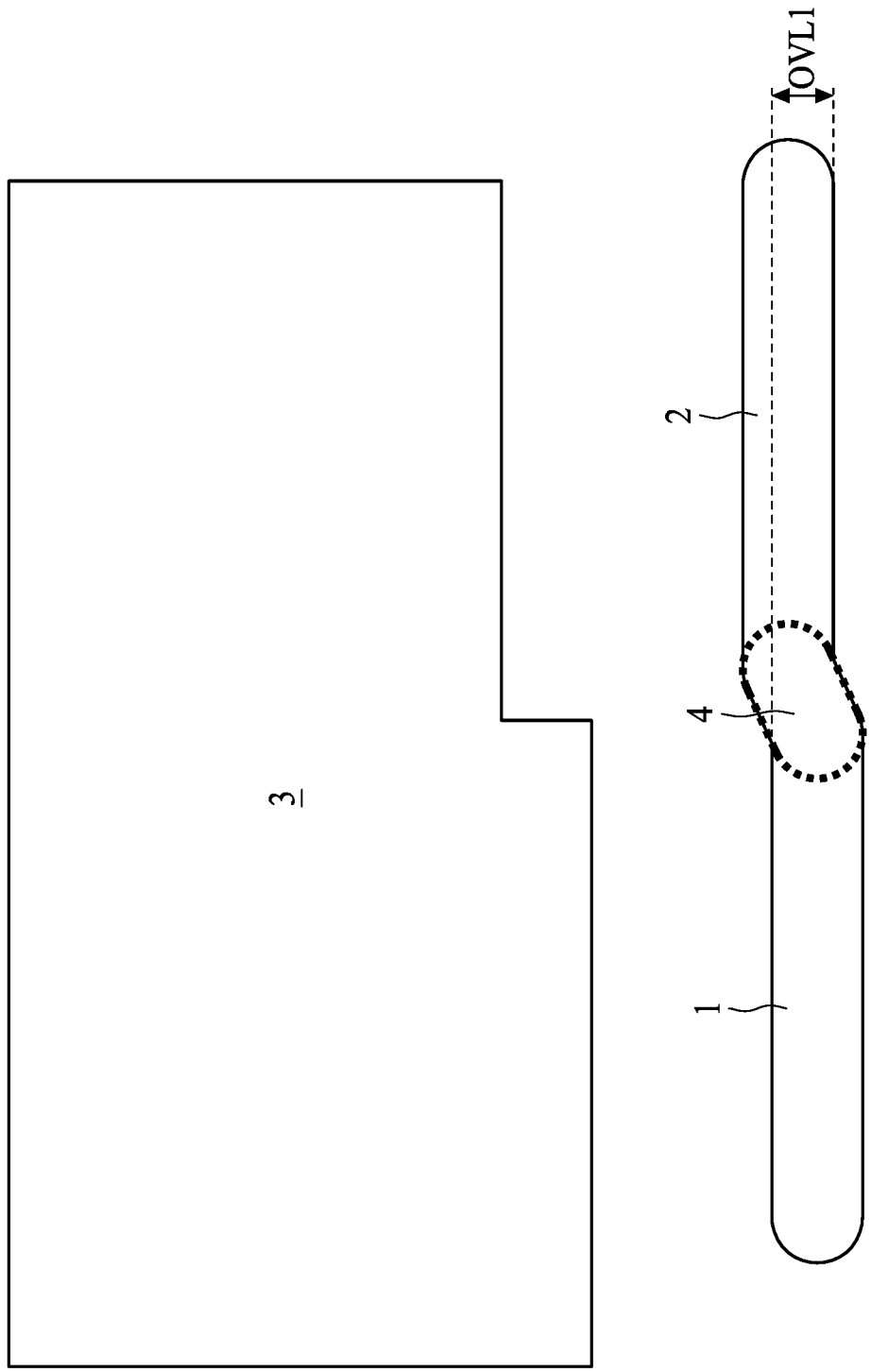
Figure 7C:
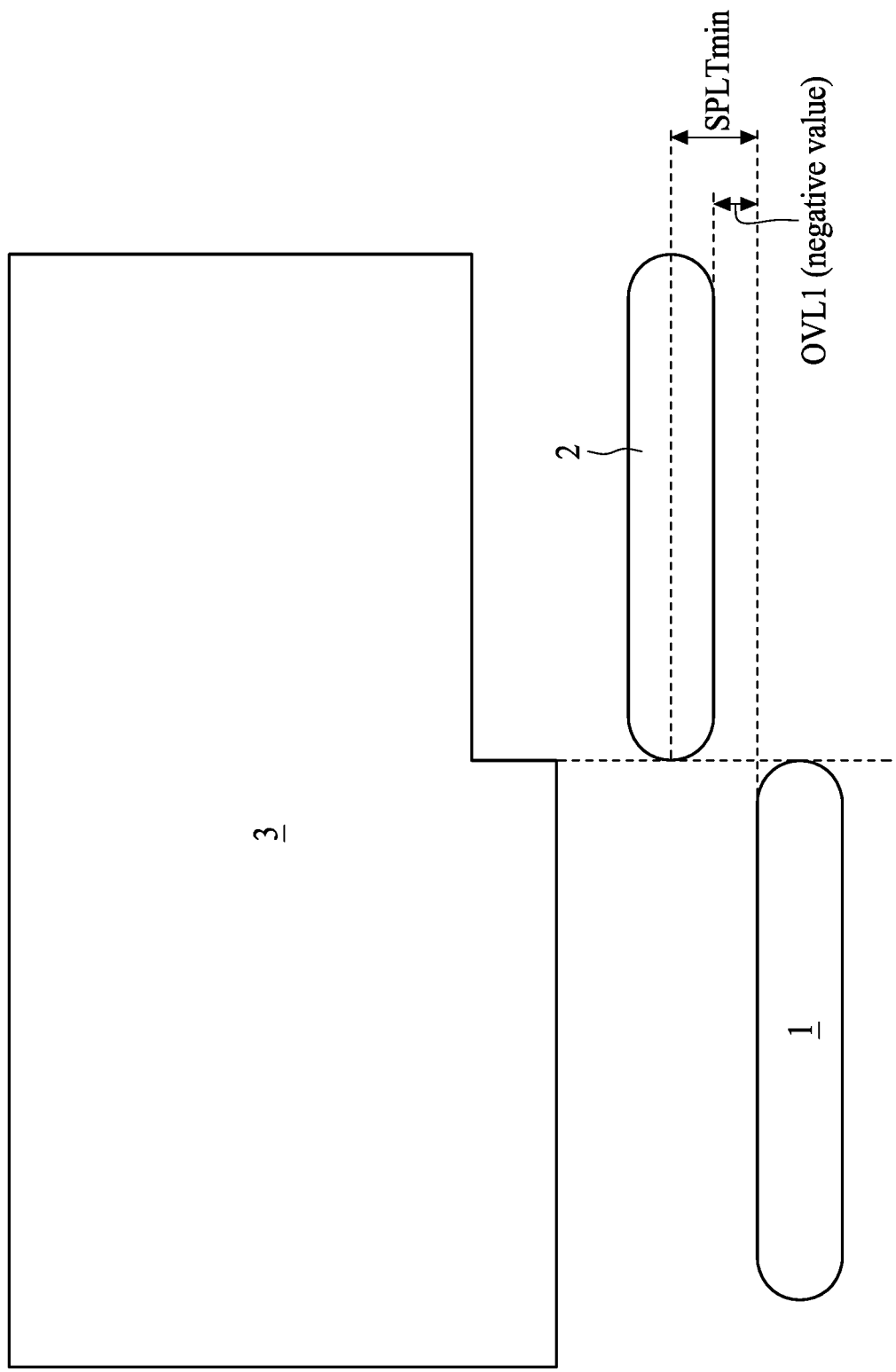

In operation 9053, if the first separation SP1 is equal to zero, the first transversal overlap OVL1 is identified. If the first separation SP1 equals to zero and the first transversal overlap OVL1 being greater than zero, as shown in FIG. 7A, the first scattering bar 1 and the second scattering bar 2 can be connected by a third scattering bar 4, as shown in FIG. 7B, similar to the previously discussed FIG. 5B to FIG. 5C. As previously described in FIG. 5B, the first scattering bar 1 and the second scattering bar 2 may be connected without relative displacement. Referring to FIG. 7C, if the first separation SP1 is equal to zero and the first transversal overlap OVL1 is less than zero or a negative value, the first scattering bar 1 and the second scattering bar 2 are to be displaced following a minimal displacement rule.

Figure 7D:
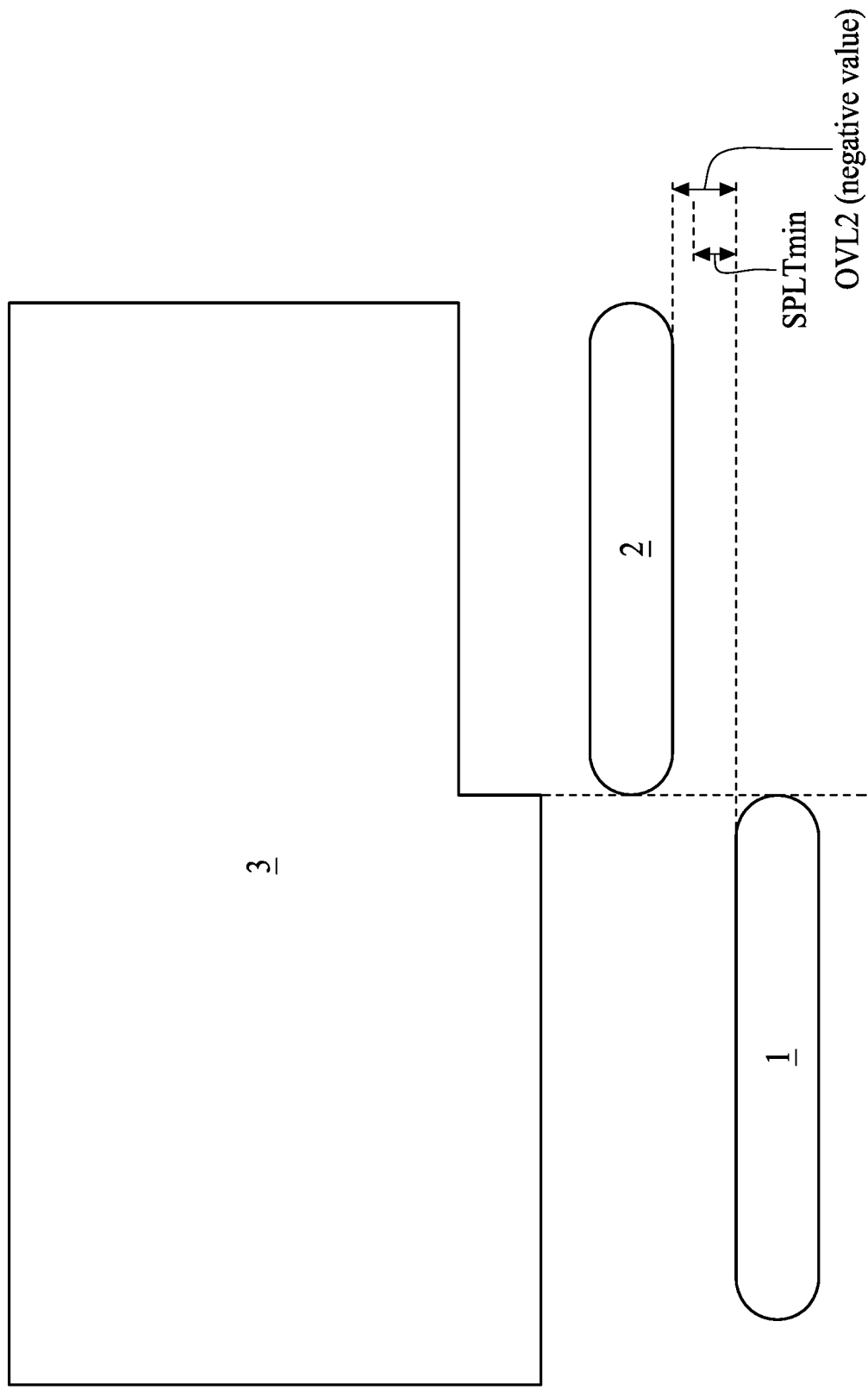

Under the condition illustrated in FIG. 7C, if an absolute value of a transversal overlap between two adjacent scattering bars is smaller than a minimum transversal split $SPLT_{min}$, the two adjacent scattering bars may not be manufactured due to resolution limit of an e-beam writer. The minimum transversal split $SPLT_{min}$ is determined by the technology generation of the features, that is, each technology generation may entail different $SPLT_{min}$. The absolute value of the first transversal overlap OVL1 is compared with the technology generation-specific $SPLT_{min}$. If the absolute value of the first transversal overlap OVL1 is less than the $SPLT_{min}$, at least one of the first scattering bar 1 and the second scattering bar 2 is displaced in order to transform the first transversal overlap OVL1 to a second transversal overlap OVL2 to an extent that an absolute value of the second transversal overlap OVL2 turns greater than the $SPLT_{min}$, as shown in the transformation from FIG. 7C to FIG. 7D. The minimal displacement rule previously described entails an algorithm which figures a way of displacement involving minimal displacement and concurrently ensuring an absolute transversal overlap value to be greater than $SPLT_{min}$. As shown in FIG. 7D, since the second transversal overlap OVL2 is greater than the minimum transversal split $SPLT_{min}$, the two adjacent scattering bars 1 and 2 can be manufactured with e-beam apparatus in the current art. In contrast, if the minimal displacement rule causes the two adjacent scattering bars to be closer, for instance, forming a second transversal overlap OVL2 of a positive value such as those illustrated in FIG. 7A, connecting the two adjacent scattering bars 1 and 2 with a third scattering bar 4 can be adopted.

Referring back to FIG. 6A, if the first separation SP1 is greater than zero, then the first separation is subject to compare with a predetermined minimum separation $SP_{min}$. In some embodiments, the $SP_{min}$ may be one of the predetermined criteria of disposing scattering bars. If a separation of two adjacent scattering bars is smaller than the minimum separation $SP_{min}$, the scattering bar may not be able to be formed due to the resolution limitations of the e-beam writer. The minimum separation $SP_{min}$ can be determined by the technology generation of the features, that is, each technology generation may entail different $SP_{min}$. In some embodiments, the minimum separation $SP_{min}$ equals to W/2, or one-half of the scattering bar width W, where the width W is a technology generation-specific value. If the first separation SP1 is greater than the minimum separation $SP_{min}$, the first scattering bar 1 and the second scattering bar 2 may not need to be displaced. If the first separation SP1 is smaller than the minimum separation $SP_{min}$, the first scattering bar 1 and the second scattering bar 2 may need to be displaced following a minimal displacement rule, as will be subsequently discussed in FIG. 8A to FIG. 8C.

Figure 6C:
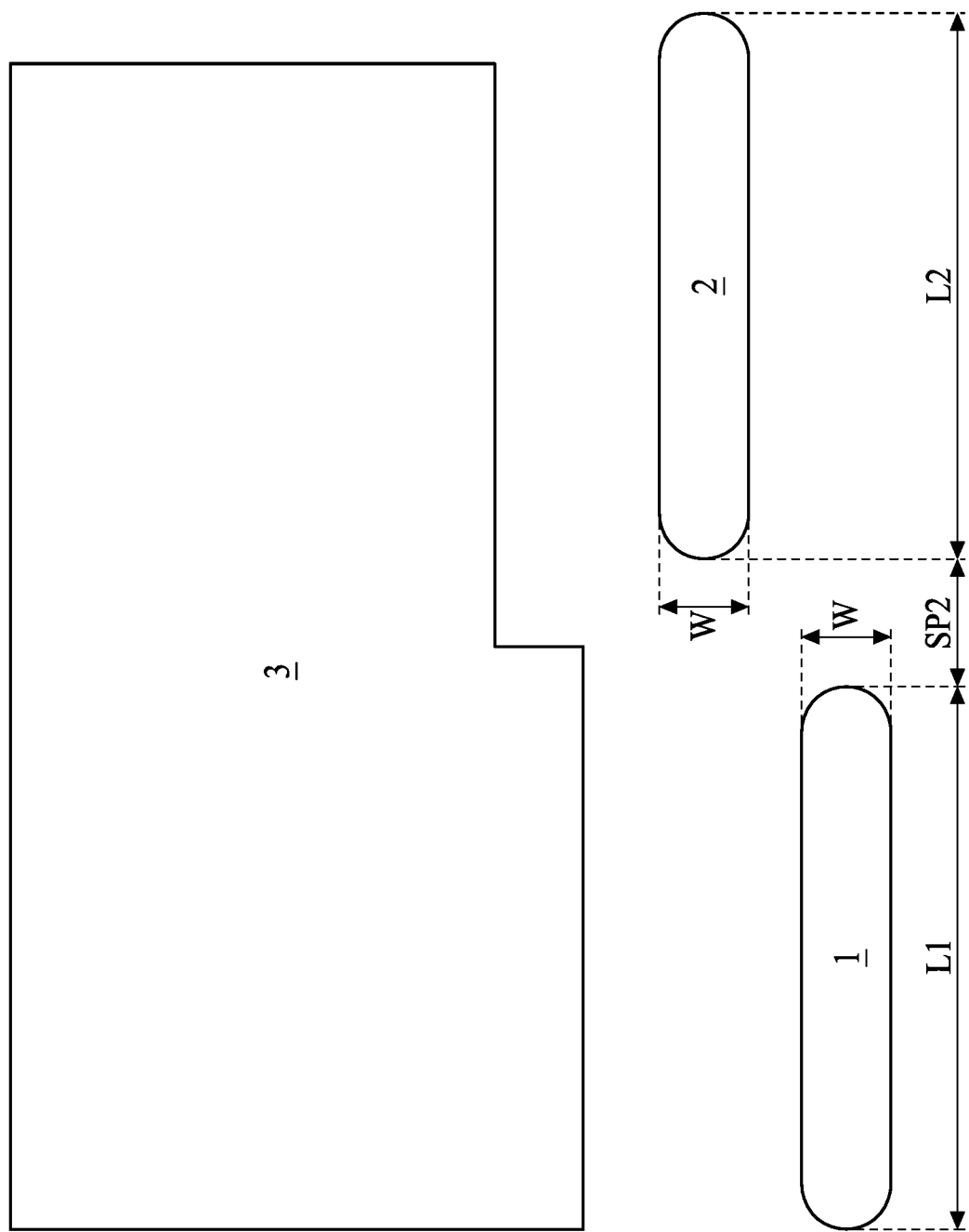

Referring to FIG. 6C, in some embodiments, at least one of the first scattering bar 1 and the second scattering bar 2 may be displaced if the first separation SP1 is smaller than the minimum separation $SP_{min}$. The first separation SP1 is increased to a second separation SP2 along a separation direction, wherein the second separation SP2 is at least greater than or equal to the minimum separation $SP_{min}$.

Figure 6D:
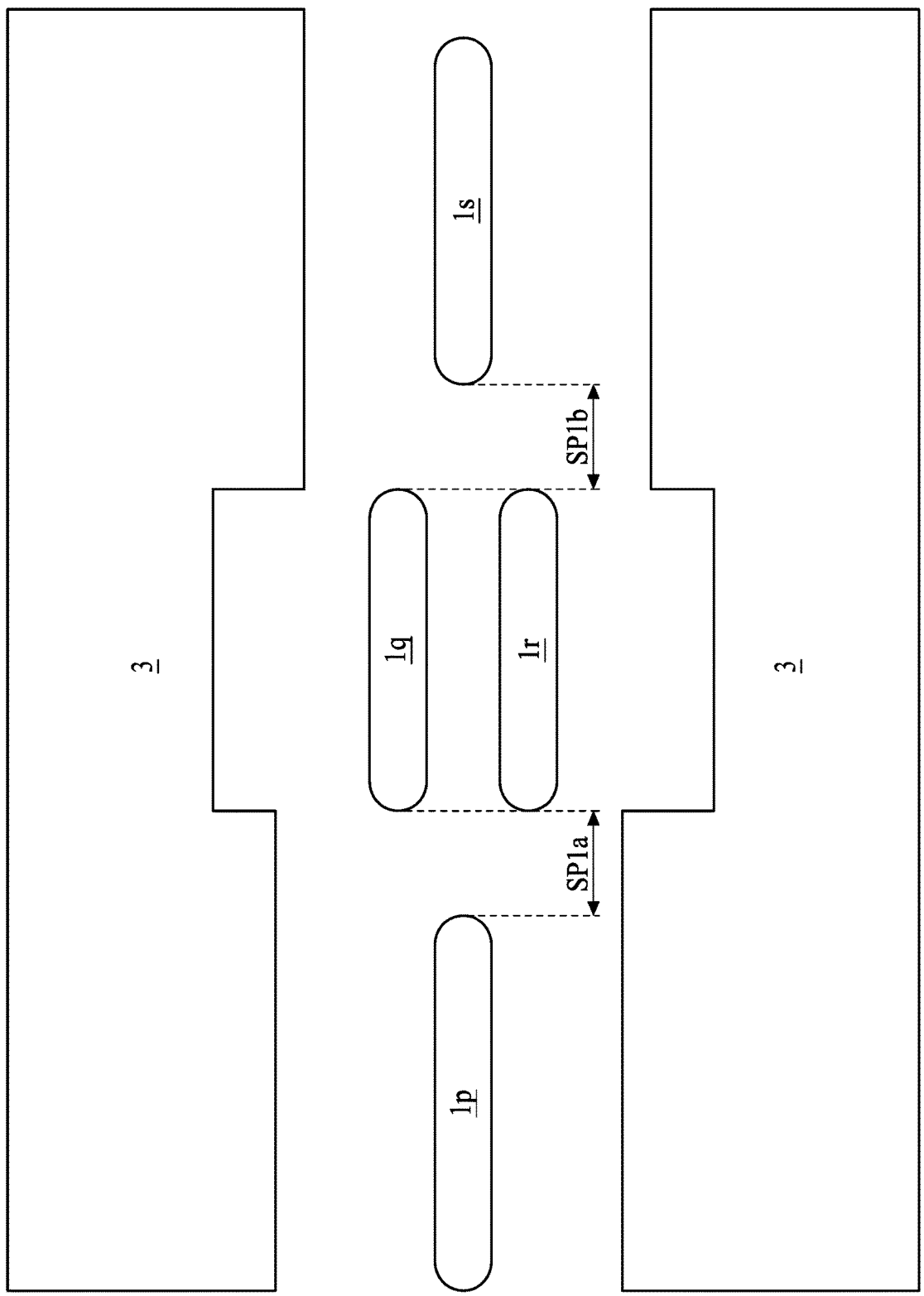
Figure 6E:
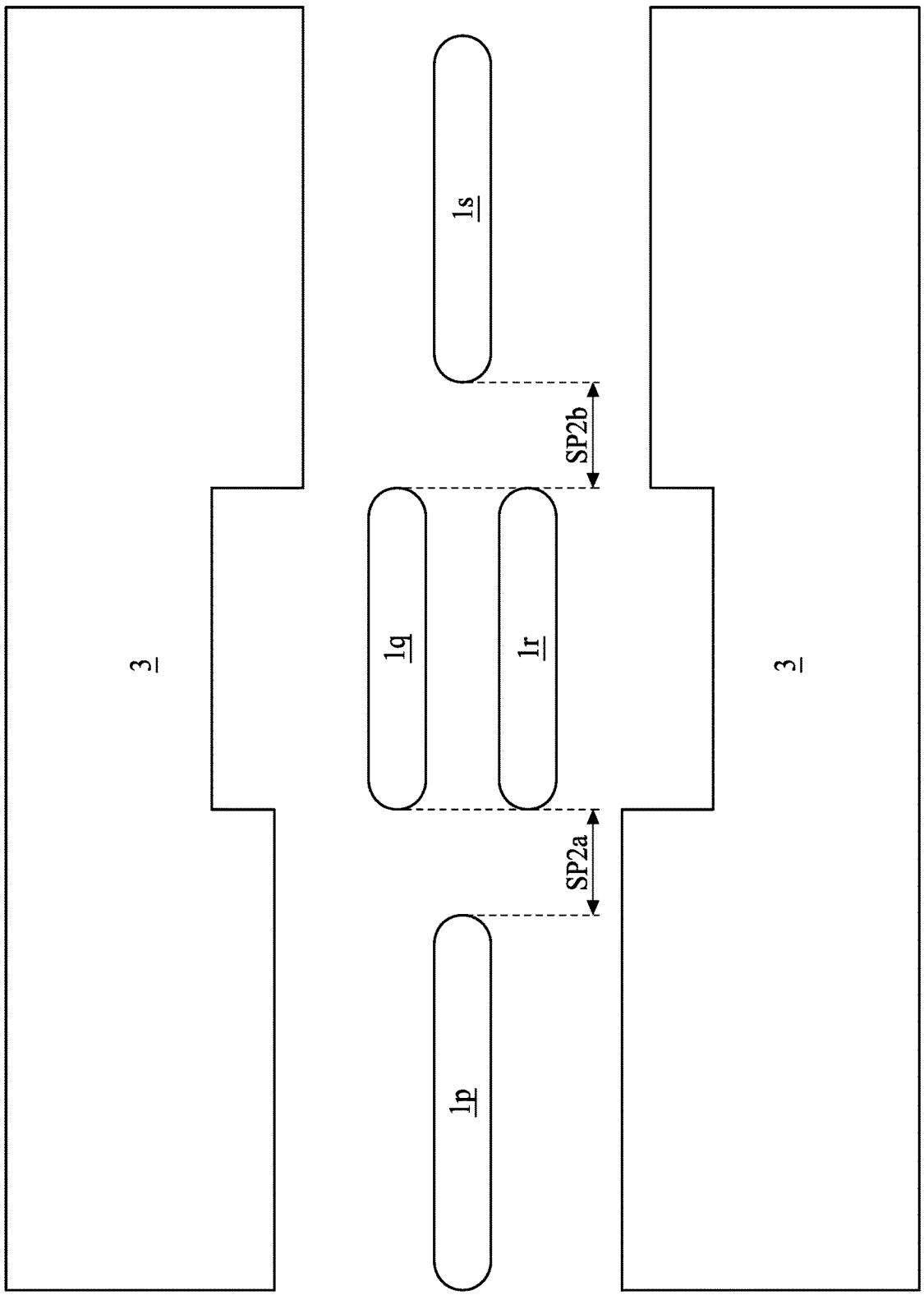

Referring to FIG. 6D, a first scattering bar 1p may be adjacent to a plurality of scattering bars, for example a second scattering bar 1q and a third scattering bar 1r each laterally separated by a first separation SP1a. A fourth scattering bar is may be adjacent to a plurality of scattering bars, for example the second scattering bar 1q and the third scattering bar 1r each laterally separated by a second separation SP1b. If the first separation SP1a and the second separation SP1b are greater than the minimum separation $SP_{min}$, the first scattering bar 1 and the second scattering bar 2 may not need to be displaced. If the first separation SP1a and/or the second separation SP1b are smaller than the minimum separation $SP_{min}$, the first scattering bar 1 and the second scattering bar 2 may need to be displaced. As shown in FIG. 6E, the first separation SP1a and the second separation SP2 are respectively increased to a third separation SP2a and a fourth separation SP2b along a separation direction, wherein the third separation SP2a and the fourth separation SP2b are at least greater than or equal to the minimum separation $SP_{min}$.

Figure 8A:
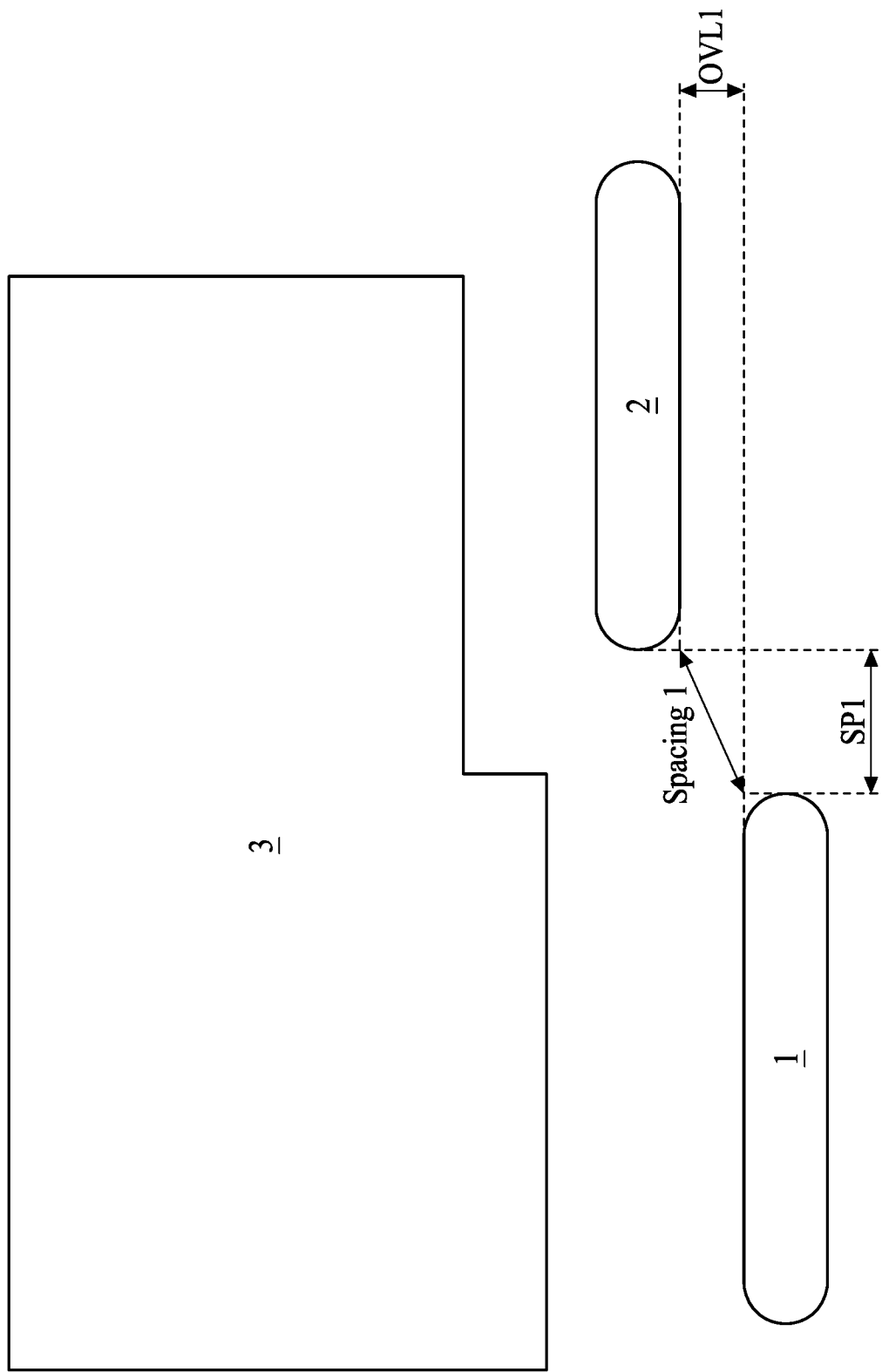
FIG. 8A to 8B are schematic diagrams illustrating a mask during an intermediate stage of manufacturing operations, in accordance with some embodiments of the present disclosure.
Figure 8B:
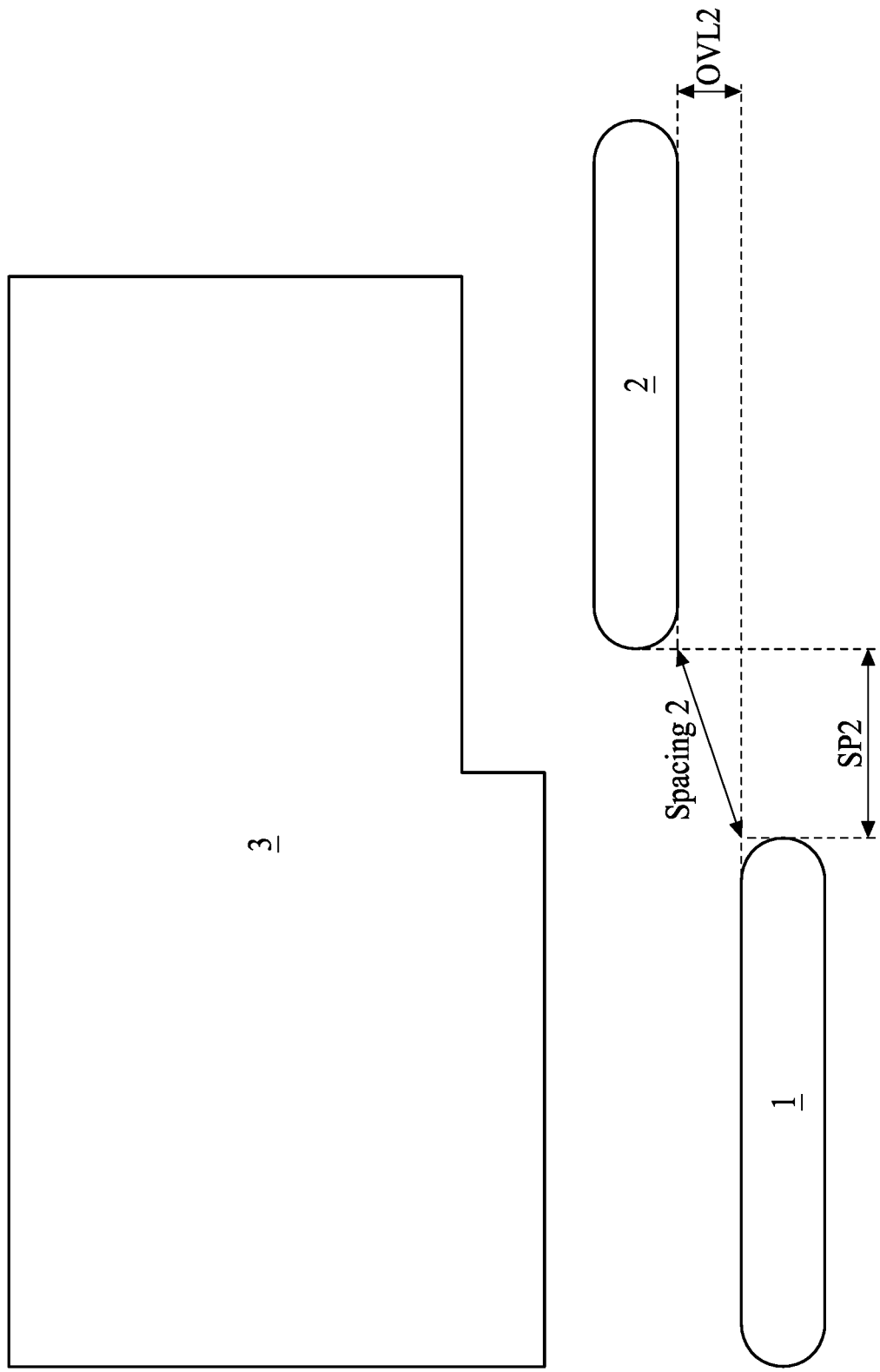

Referring to FIG. 8A, the first separation SP1 is smaller than the minimum separation $SP_{min}$ and the first transversal overlap OVL1 is less than zero. In some embodiments, at least one of the first scattering bar 1 and the second scattering bar 2 can be displaced along and/or perpendicular to a transversal direction. As shown in FIG. 8B, the first separation SP1 may be adjusted to a second separation SP2. In some embodiments, the first transversal overlap OVL1 may be adjusted to the second transversal overlap OVL2. In order to comply with the aforesaid minimal displacement rule, a lookup table illustrated in FIG. 8C is provided, demonstrating a selection of various types of acceptable separations. In some embodiments, the type of acceptable separation selected shall be the one involves minimal displacement of the first scattering bar 1 and/or the second scattering bar 2.

The combination of the separation and transversal overlap shall comply with the separation $(X_n)$-overlap $(Y_n)$ table combination pertinent to the first scattering bar 1 and the second scattering bar 2 provided in FIG. 8C. The separation $(X_n)$-overlap $(Y_n)$ table can be decided by the technology generation of the features, that is, different technology generation may entail different tables. For example, referring to FIG. 8A to FIG. 8C, if the first separation SP1 is adjusted to the second separation SP2 by X3, and the first transversal overlap OVL1 is adjusted to the second transversal overlap OVL2 by Y3, it is because the Combination 3 is selected for such displacement due to the fact that Combination 3 provides smallest displacement of the first scattering bar 1 and/or the second scattering bar 2. All of Combinations shown separation $(X_n)$-overlap $(Y_n)$ table provides acceptable separations under given technology generations. Selection from the Combinations provides better conformity with the contour of the adjacent edges of the target pattern in order to alleviate the deterioration of lithographical performance.

In some other embodiments, a spacing between the first scattering bar 1 and the second scattering bar 2 shall comply with the minimum spacing table, wherein the spacing of the first scattering bar 1 and the second scattering bar 2 equals to the root sum square of the separation and the transversal overlay, i.e. $(seperation^2+transversal\ overlay^2)^{0.5}$ calculated by Pythagorean equation. The minimum spacing table may include combinations decided by the technology generation of the features, that is, different technology generation may entail different tables. For example, Combination 3 is selected, therefore the spacing $(seperation^2+transversal\ overlay^2)^{0.5}$ of the first scattering bar 1 and the second scattering bar 2 shall be greater than SPC3 derived from the table.

Figure 9:
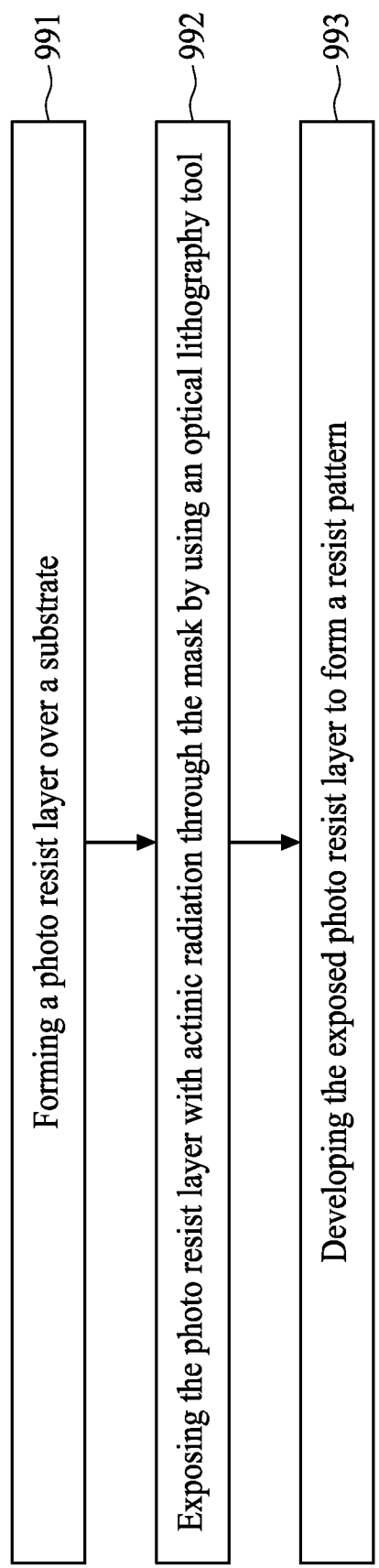
FIG. 9 is a flow chart representing methods for using a mask for manufacturing a semiconductor device, in accordance with some embodiments of the present disclosure.

Referring to FIG. 9, FIG. 9 is a flow chart representing methods for using a mask for manufacturing a semiconductor device, in accordance with some embodiments of the present disclosure. The methods include forming a photo resist layer over a substrate (operation 991), exposing the photo resist layer with actinic radiation through the mask by using an optical lithography tool (operation 992), and developing the exposed photo resist layer to form a resist pattern (operation 993). Herein the mask includes the target pattern 3 and the scattering bars illustrated or manufactured by fabrication methods provided in FIG. 1 to FIG. 8C.

It is noted that the operations discussed in the present invention may be implemented by software such that the foregoing methods disclosed therein can be automatically performed during the mask making process. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions could be received from a remote storage device, such as a server on a network. The present invention can also be implemented in hardware systems, discrete hardware or firmware.

Some embodiments of the present disclosure provide a method for fabricating a mask, including obtaining a target pattern to be imaged onto a substrate, providing a first scattering bar and a second scattering bar adjacent to consecutive edges of the target pattern, identifying a first length of the first scattering bar and a second length of the second scattering bar, connecting the first scattering bar and the second scattering bar when any of the first length and the second length is smaller than a predetermined value, identifying a separation between the first scattering bar and the second scattering bar subsequent to identifying the first length and the second length, disposing the first scattering bar and the second scattering bar in a first fashion when the separation is equal to zero, and disposing the first scattering bar and the second scattering bar in a second fashion when the separation is greater than zero.

Some embodiments of the present disclosure provide a mask, including a target pattern having consecutive edges, and a scattering bar having disposed adjacent to consecutive edges of the target pattern, wherein the scattering bar includes: a first segment, and a second segment having a first end connecting to the first segment, wherein a first angle between the first segment and the second segment is less than 180 degree.

Some embodiments of the present disclosure provide a method for pattern formation method using a mask for manufacturing a semiconductor device, including forming a photo resist layer over a substrate, exposing the photo resist layer with actinic radiation through the mask by using an optical lithography tool, and developing the exposed photo resist layer to form a resist pattern, wherein the mask includes a target pattern having consecutive edges, and a scattering bar having disposed adjacent to consecutive edges of the target pattern, wherein the scattering bar includes: a first segment; and a second segment having a first end connecting to the first segment, wherein a first angle between the first segment and the second segment is less than 180 degree.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a mask, comprising:
    obtaining a target pattern to be imaged onto a substrate;
    providing a first scattering bar and a second scattering bar adjacent to consecutive edges of the target pattern, wherein the second scattering bar is not aligned with the first scattering bar along a longitudinal direction of the first scattering bar;
    identifying a first length of the first scattering bar and a second length of the second scattering bar;
    connecting the first scattering bar and the second scattering bar when any of the first length and the second length is smaller than a predetermined value;
    identifying a separation between the first scattering bar and the second scattering bar subsequent to identifying the first length and the second length;
    disposing the first scattering bar and the second scattering bar in a first fashion when the separation is equal to zero; and
    disposing the first scattering bar and the second scattering bar in a second fashion when the separation is greater than zero.

2. The method of claim 1, wherein no relative displacement is caused when connecting the first scattering bar and the second scattering bar.

3. The method of claim 1, wherein disposing the first scattering bar and the second scattering bar in a second fashion comprises comparing the separation with one-half of the scattering bar width.

4. The method of claim 2, wherein a third scattering bar is formed between the first scattering bar and the second scattering bar when connecting the first scattering bar and the second scattering bar.

5. The method of claim 3, further comprising:
    increasing the separation by displacing at least one of the first scattering bar and the second scattering bar when the separation is smaller than one-half of the scattering bar width.

6. The method of claim 5, wherein the displacing at least one of the first scattering bar and the second scattering bar comprises displacing along or perpendicular to a separation measuring direction.

7. The method of claim 1, wherein disposing the first scattering bar and the second scattering bar in a first fashion comprises identifying a transversal overlap feature of the first scattering bar and the second scattering bar.

8. The method of claim 7, wherein disposing the first scattering bar and the second scattering bar in a first fashion comprises connecting the first scattering bar and the second scattering bar when the transversal overlap feature is greater than zero.

9. The method of claim 7, wherein disposing the first scattering bar and the second scattering bar in a first fashion comprises displacing at least one of the first scattering bar and the second scattering bar when the transversal overlap feature is smaller than zero.

10. The method of claim 9, wherein displacing at least one of the first scattering bar and the second scattering bar comprises increasing the transversal overlap feature.

11. The method of claim 9, wherein displacing at least one of the first scattering bar and the second scattering bar comprises decreasing the transversal overlap feature until the transversal overlap feature is greater than zero.

12. The method of claim 1, further comprising performing optical proximity correction (OPC) subsequent to disposing the first scattering bar and the second scattering bar.

13. A method for fabricating a mask, comprising:
    obtaining a target pattern to be imaged onto a substrate;
    providing a first scattering bar and a second scattering bar extending along a primary direction and adjacent to consecutive edges of the target pattern, wherein the first scattering bar and the second scattering bar partially overlaps in the primary direction; and
    connecting the first scattering bar and the second scattering bar with a connecting segment, wherein the first scattering bar is not parallel to the connecting segment.

14. The method of claim 13, wherein a length of the connecting segment is shorter than a length the first scattering bar.

15. The method of claim 13, further comprising performing optical proximity correction (OPC) subsequent to connecting the first scattering bar and the second scattering bar.

16. A method for fabricating a mask, comprising:
   obtaining a target pattern to be imaged onto a substrate;
   providing a first scattering bar and a second scattering bar adjacent to consecutive edges of the target pattern, wherein the second scattering bar is apart from the first scattering bar; and
   connecting the first scattering bar and the second scattering bar with a connecting segment, wherein the first scattering bar is not parallel to the connecting segment.

17. The method of claim 16, wherein the second scattering bar is not parallel to the connecting segment.

18. The method of claim 16, further comprising performing optical proximity correction subsequent to connecting the first scattering bar and the second scattering bar.

19. The method of claim 16, wherein the first scattering bar extends along a first direction, and the first scattering bar is free from overlapping with the second scattering bar along a second direction orthogonal to the first direction.

20. The method of claim 16, wherein a length of the connecting segment is shorter than the first scattering bar.

* * * * *